US010587250B2

(12) United States Patent
Hanke et al.

(10) Patent No.: US 10,587,250 B2
(45) Date of Patent: Mar. 10, 2020

(54) CURRENT-STARVING IN TUNABLE-LENGTH DELAY (TLD) CIRCUITS EMPLOYABLE IN ADAPTIVE CLOCK DISTRIBUTION (ACD) SYSTEMS FOR COMPENSATING SUPPLY VOLTAGE DROOPS IN INTEGRATED CIRCUITS (ICS)

(71) Applicant: QUALCOMM Incorporated, San Diego, CA (US)

(72) Inventors: Carl Christopher Hanke, Chapel Hill, NC (US); Yeshwant Nagaraj Kolla, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 15 days.

(21) Appl. No.: 16/038,633

(22) Filed: Jul. 18, 2018

(65) Prior Publication Data
US 2020/0028514 A1 Jan. 23, 2020

(51) Int. Cl.
*H03K 5/133* (2014.01)
*G06F 1/04* (2006.01)
(Continued)

(52) U.S. Cl.
CPC .............. *H03K 5/133* (2013.01); *G06F 1/04* (2013.01); *G06F 1/305* (2013.01); *G06F 1/324* (2013.01);
(Continued)

(58) Field of Classification Search
CPC ........ G06F 1/305; G06F 1/263; G06F 1/3212; G06F 2005/00065; G06F 2005/00039;
(Continued)

(56) References Cited

U.S. PATENT DOCUMENTS 6,586,971 B1 * 7/2003 Naffziger .................. G06F 1/10
327/41
6,804,793 B2 * 10/2004 Josephson ................. G06F 1/04
327/175

(Continued)

FOREIGN PATENT DOCUMENTS

WO 2018006091 A1 1/2018

OTHER PUBLICATIONS

Bowman, Keith A. et al., "A 16 nm All-Digital Auto-Calibrating Adaptive Clock Distribution for Supply Voltage Droop Tolerance Across a Wide Operating Range," IEEE Journal of Solid-State Circuits, vol. 51, No. 1, Jan. 2016, pp. 8-17.

*Primary Examiner* — Thomas J. Hiltunen
(74) *Attorney, Agent, or Firm* — W&T/Qualcomm

(57) ABSTRACT

Current-starving in tunable-length delay (TLD) circuits in adaptive clock distribution (ACD) systems for compensating voltage droops in clocked integrated circuits (ICs) is disclosed. Voltage droops slow propagation of signals in clocked circuits. However, clock delay circuits in a TLD circuit increase a clock period by increasing a clock delay in response to a voltage droop. In large power distribution networks (PDN), impedance can delay and reduce the magnitude of voltage droops experienced at the TLD circuit. If the voltage droop at the TLD circuit is smaller than at the clocked circuit, then the clock period isn't stretched enough to compensate the slowed clocked circuit. A current-starved TLD circuit starves the clock delay circuits of current in response to a voltage droop indication, which further increases the clock signal delay, and further stretches the clock period to overcome a larger voltage droop in clocked circuits in other areas of the IC.

28 Claims, 15 Drawing Sheets

(51) Int. Cl.
*H03K 5/134* (2014.01)
*G06F 1/30* (2006.01)
*G06F 1/324* (2019.01)
*H03K 5/00* (2006.01)

(52) U.S. Cl.
CPC ... *H03K 5/134* (2014.07); *H03K 2005/00019* (2013.01); *H03K 2005/00032* (2013.01); *H03K 2005/00039* (2013.01); *H03K 2005/00065* (2013.01); *H03K 2005/00195* (2013.01)

(58) Field of Classification Search
CPC .......... G06F 2005/00032; H03K 5/133; H03K 5/134; H03K 5/14; H03L 7/0802
See application file for complete search history.

(56) References Cited

U.S. PATENT DOCUMENTS

| | | | |
|---|---|---|---|
| 6,922,111 B2 * | 7/2005 | Kurd | G06F 1/10 331/48 |
| 7,225,349 B2 * | 5/2007 | Tam | G06F 1/04 327/101 |
| 7,907,018 B2 * | 3/2011 | Pellerano | H03L 7/099 331/1 A |
| 8,054,101 B2 * | 11/2011 | Chen | H03M 1/82 326/82 |
| 8,390,329 B1 * | 3/2013 | Sridhara | H03K 5/133 326/26 |
| 8,390,355 B2 * | 3/2013 | Quan | H03L 7/16 327/261 |
| 8,736,314 B2 * | 5/2014 | Kim | H03K 19/0016 327/108 |
| 9,413,344 B2 | 8/2016 | Bowman et al. | |
| 9,628,089 B1 | 4/2017 | Jain et al. | |
| 9,772,375 B2 | 9/2017 | Turullols et al. | |
| 10,340,929 B2 * | 7/2019 | Choi | H03K 3/03 |
| 2007/0222493 A1 * | 9/2007 | Afentakis | H03K 5/133 327/276 |
| 2012/0187991 A1 | 7/2012 | Sathe et al. | |
| 2016/0020758 A1 * | 1/2016 | Kim | H03K 5/134 327/103 |
| 2017/0177055 A1 * | 6/2017 | Whatmough | G06F 1/08 |

* cited by examiner

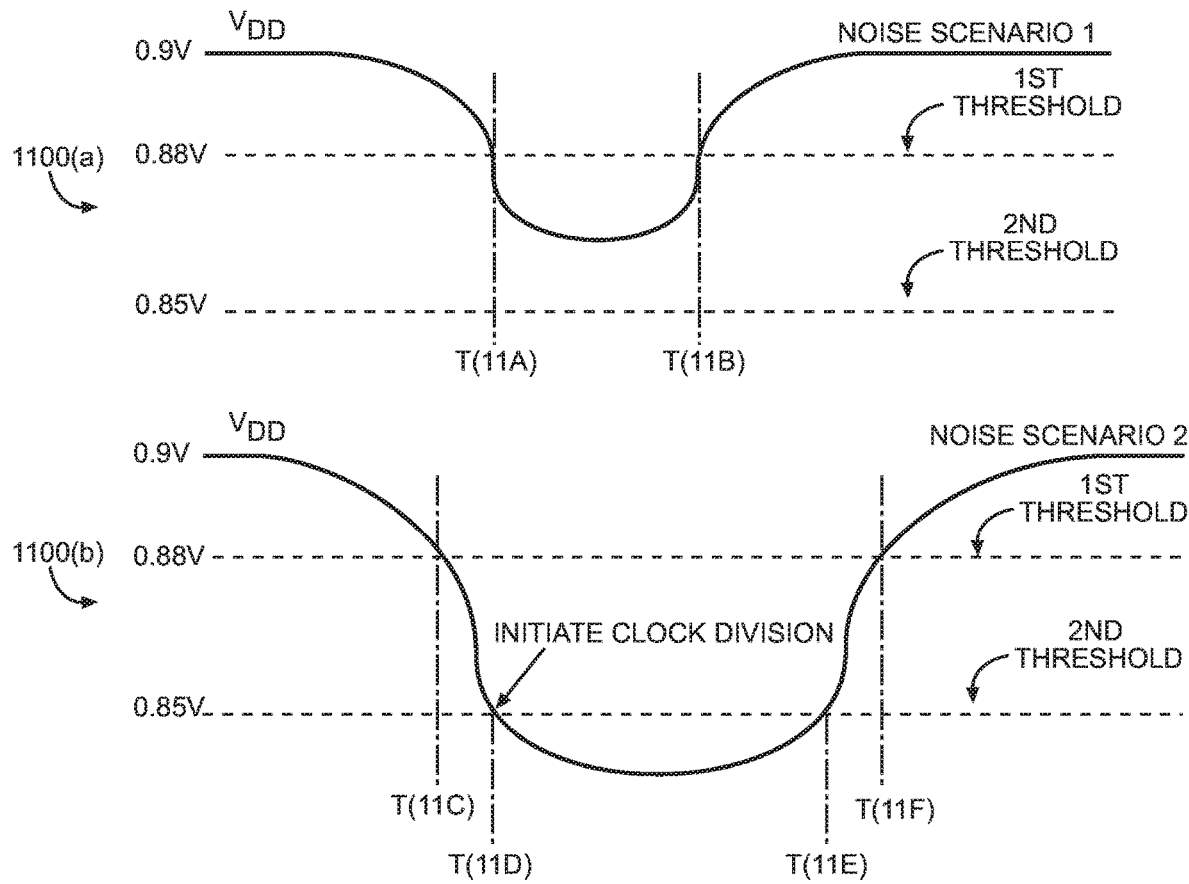
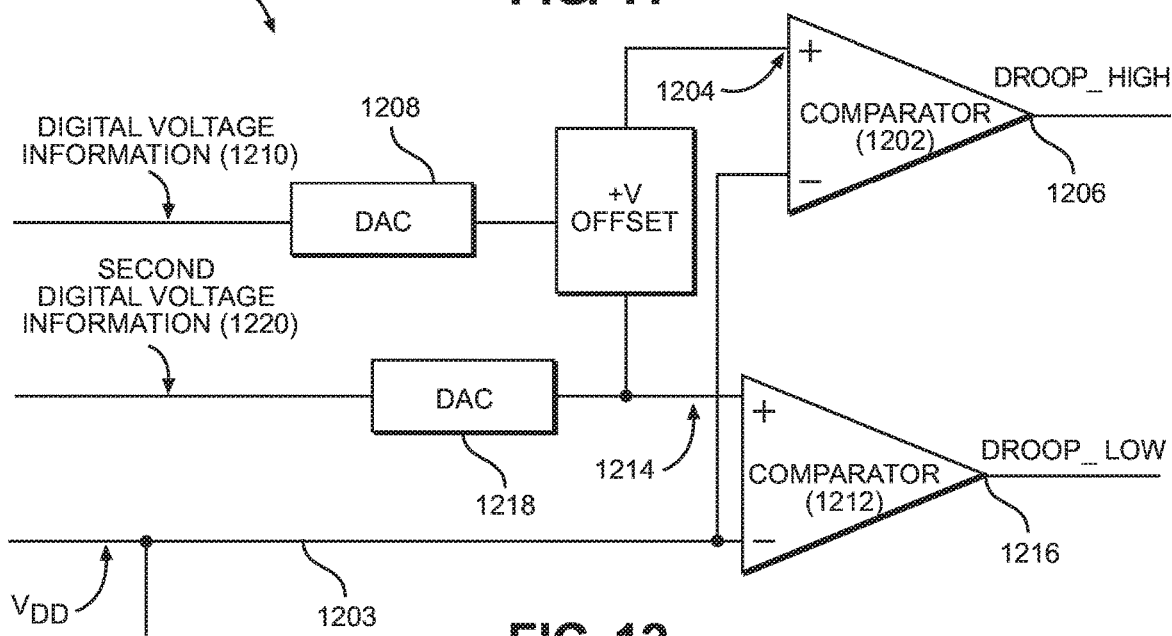
FIG. 11
FIG. 12

CURRENT-STARVING IN TUNABLE-LENGTH DELAY (TLD) CIRCUITS EMPLOYABLE IN ADAPTIVE CLOCK DISTRIBUTION (ACD) SYSTEMS FOR COMPENSATING SUPPLY VOLTAGE DROOPS IN INTEGRATED CIRCUITS (ICS)

BACKGROUND

I. Field of the Disclosure

The technology of the disclosure relates to adaptive clock distribution (ACD) systems for reducing a clock frequency of a clock signal supplied to a clocked circuit in response to a detected supply voltage droop, and more particularly to tunable-length delay (TLD) circuits employed in the ACD systems to stretch the clock signal.

II. Background

Circuits such as central processing units (CPUs) or digital signal processors (DSPs) require power to operate. In this regard, a power supply provides a supply voltage to a powered circuit. During normal operation of a circuit, a power supply may undergo a supply voltage droop (also referred to herein as a "voltage droop") associated with an abrupt increase in demand for power supply current supplied by the power supply, and/or an operational change to the power supply, thereby inducing large current transients (e.g., di/dt events) in a power delivery system. In integrated circuits (ICs) (e.g., a System-On-Chip (SoC)), voltage droops of as much as 200 milli-Volts (mV) can occur. The magnitude and duration of a voltage droop in a power supply depends on the interaction of capacitive and inductive parasitics at board, package, and die levels as a result of changes in current demand Thus, voltage droops affect circuits globally across the die and may occur with frequencies ranging in delay from a few nanoseconds (ns) (i.e., high frequency) to a few microseconds (ms) (i.e., low frequency).

High-frequency voltage droops may result in the largest magnitude change in power supply voltage, and thus have a severe impact on powered circuit performance and energy efficiency. For example, a CPU that executes instructions may be a powered circuit that is powered by a high frequency switching power supply. In a CPU, typical current consumption may be on the order of hundreds of milliamps (mA) to one (1) amp (A). If, for example, the CPU executes back-to-back complex instructions (e.g., hardware multiplies), current consumption may quickly change at a rate of about one (1) amp (A) per nanosecond (ns), thereby causing a voltage droop. A droop in the power supply voltage provided to a logic gate can decrease drive strength of the logic gate, resulting in increased delay. As long as the voltage droop does not cause the voltage level provided by the power supply to the CPU to fall below a minimum acceptable operating voltage of the CPU, the CPU continues to function properly. However, if the voltage droop causes the voltage level of the power supply provided to the CPU to drop below the minimum acceptable operating voltage, delay in logic circuits in the CPU may increase significantly while a system clock for synchronizing clocked circuits in the CPU maintains a constant clock frequency. This may cause operations of the logic circuits in the CPU to be unable to complete within one clock period, thereby causing an error in the CPU.

Thus, to compensate for voltage droop that can occur in a power supply supplying power to the CPU, a voltage operating margin (e.g., a voltage guardband) can be designed into the power supply. The voltage operating margin of a power supply is a voltage amount by which the supply voltage is increased above the minimum acceptable operating voltage of a powered circuit to ensure that even in the worst-case anticipated voltage droop scenario, the supply voltage does not drop below the minimum acceptable operating voltage. The operating margin of the power supply voltage represents additional voltage supplied to the powered circuit to assure proper circuit operation when voltage droop events occur, which may be as infrequent as every several milliseconds (ms). Thus, the operating margin significantly increases overall power consumption to manage voltage droop events that may occur infrequently. Adding a supply voltage margin of 200 mV in a SoC design, for example, may cause a thermal design point limit to be exceeded (or transistor voltage reliability limits to be exceeded). To avoid power consumption concerns created by the addition of a voltage operating margin, protection against a voltage droop can also be provided by reducing the frequency at which the CPU operates. The longer period of a lower frequency system clock provides a timing margin as protection against the occasional increase in delay in logic gates resulting from a voltage droop. However, reducing the normal operating frequency of a CPU may make it difficult to meet performance objectives, so it is preferable to respond to voltage droop events individually by slowing the clock frequency when a voltage droop is detected.

The clock signal is provided to the CPU by an adaptive clock distribution (ACD) circuit, which can include a clock divider circuit to reduce the clock frequency in response to a voltage droop. The clock signal provided to the CPU from the clock divider circuit will change frequency approximately three (3) clock cycles after receiving an indication of a voltage droop. CPU errors could occur during those three cycles as a result of the increased delay in logic gates of the CPU. Therefore, the ACD circuit also includes a tunable-length delay (TLD) circuit to immediately stretch the clock period until the clock divider circuit is able to respond to the voltage droop. The TLD circuit includes a delay path formed of logic gates through which the clock signal to the CPU propagates. The logic gates of the TLD circuit receive the same power supply voltage as the logic gates of the CPU. Thus, in the event of a voltage droop that increases delay in the logic gates of the CPU, delay of the clock signal through the logic gates of the TLD circuit is also increased by a similar amount. In this way, the TLD circuit stretches the clock period by an amount needed to compensate for the increased delay in the CPU resulting from the voltage droop.

Adaptive clock distribution systems to date have been implemented at the CPU level, or in small SoCs with two (2) to four (4) CPUs, for example. In a CPU or small SoC, a power distribution network (PDN) has very low impedance, such that noise events occur simultaneously and at a same magnitude across the power domain. In this case, the clock delay that is immediately added by the TLD circuit in response to a supply voltage droop will stretch the clock signal by an amount corresponding to the increase in delay occurring in logic gates across the CPU or small SoC, and CPU errors are thus avoided. However, large ICs or SoC devices may integrate a large number of CPUs, in addition to high speed memory, so the power distribution network can be very large and have significant impedance through which a large isolated di/dt (i.e., noise) event travels. Due to the impedance, a noise event in one region of the power distribution network is decoupled from other remote regions. As a result, a voltage droop in one region of the power distribution network may be delayed and diminished in magnitude before arriving in another region.

In this regard, FIG. 1 is an example of a power distribution network 100 in which a power supply voltage droop 102 ("voltage droop 102") is induced in a power supply voltage $V_{IN}$ in an upper left corner sector 104 of the power distribution network 100. FIG. 2 is a graph 200 of simulation results showing power supply levels across regions of the power distribution network 100 in FIG. 1 in response to a di/dt event in the upper left corner sector 104 of the power distribution network 100. As shown in FIG. 2, the voltage droop 102 is a temporary (e.g., <10 nanoseconds (ns)) drop or reduction in the power supply voltage $Y_{IN}$. The voltage droop 102 local to the di/dt event has a maximum magnitude of approximately 90 millivolts (mV), while the magnitude seen in other regions may be as little as 30 mV. Thus, the decoupled noise experienced by a TLD circuit in the middle of the power distribution network 100 is of a much smaller magnitude than the magnitude at the source of the droop event. An increase in delay of the clock signal in the logic gates in the TLD circuit in response to the lower magnitude decoupled noise will be smaller than an increase in delay in logic gates at the origin of the voltage droop where the magnitude of the droop is largest. Therefore, the delay added to the clock signal by the TLD circuit in response to the decoupled noise will not sufficiently compensate for the delay in the CPU, and errors may occur.

SUMMARY OF THE DISCLOSURE

Aspects disclosed in the detailed description include current-starving in tunable-length delay (TLD) circuits employable in adaptive clock distribution (ACD) systems for compensating supply voltage droops in integrated circuits (ICs). A TLD circuit is provided to increase (e.g., stretch) a delay of a clock signal, generally by a few clock cycles, in response to a voltage droop of a supply voltage before the ACD system may respond to the voltage droop to slow down (e.g., divide) the frequency of the clock signal. The ACD system slows down the frequency of the clock signal to avoid timing errors in a clocked circuit (e.g., a CPU) powered by the supply voltage and clocked by the clock signal, because the voltage droop may cause circuits in the clocked circuit to slow down due to a loss in drive strength. In this regard, the TLD circuit delays the clock signal by having a clock delay path formed of logic circuits that experience the same loss in drive strength by being powered by the supply voltage that incurs the voltage droop. However, the TLD circuit may experience less voltage droop than the clocked circuit, such that the TLD circuit does not stretch the clock signal enough to respond to the magnitude of the voltage droop experienced by the clocked circuit. For example, large power distribution networks (PDNs) may have significant impedance, causing a decoupling effect that delays and reduces magnitudes of voltage droops as they travel across a PDN.

In this regard, in exemplary aspects disclosed herein, the TLD circuit is a current-starved TLD circuit that starves clock delay circuits of current in response to an indication of a voltage droop. Starving the clock delay circuits further increases the clock signal delay beyond the delay caused by the reduction in drive strength of the clock delay circuits in the TLD circuit in response to the voltage droop to further stretch the clock period. The further stretching of the clock period caused by the current-starving of the TLD circuit can overcome a difference between the magnitudes of the voltage droops at the TLD circuit in an IC and other areas of the IC where clocked circuits are located. Without current-starving, the magnitude of the voltage droop at the TLD circuit may not sufficiently stretch the clock period to avoid errors in the clocked circuits.

In another exemplary aspect, the current-starved TLD circuit can be configured to stagger compression of the clock period after the clock stretching to resynchronize the delayed clock signal with the source clock signal without causing errors in the clocked circuits. The current-starved TLD circuit can stagger the compression over a plurality of periods by progressively increasing the current provided to the logic gates in the clock delay path over several clock periods. In this manner, rather than compressing the clock signal in a smaller window of time (e.g., a single clock period), the clock is compressed over a larger window of time (e.g., several clock periods) to avoid errors in the clocked circuit.

In this regard, in one aspect, a current-starved TLD circuit for delaying a clock signal distributed in an ACD system to a clocked circuit is provided. The current-starved TLD circuit comprises a clock delay circuit comprising a clock input configured to receive a clock signal, and a current-starving circuit. The current-starving circuit comprises a power input coupled to a power rail, a current output coupled to the clock delay circuit, and a droop indicator input configured to receive a droop indicator indicating a voltage droop status of a voltage droop in a supply voltage. The current-starving circuit further comprises a current-starving control circuit configured to generate a current-starving control indicator in response to the droop indicator, and a current supply circuit configured to selectively starve current supplied on the current output coupled to the clock delay circuit in response to the current-starving control indicator indicating the voltage droop status of the voltage droop in the supply voltage. The clock delay circuit is configured to generate a delayed clock signal based on a delay of the clock signal based on the selectively starved current.

In another aspect, a current-starved TLD circuit for delaying a clock signal distributed in an ACD system to a clocked circuit is provided. The current-starved TLD circuit comprises a means for receiving a clock signal, a means for receiving a droop indicator indicating a voltage droop status of a voltage droop in a supply voltage, and a means for generating a current-starving control indicator in response to the droop indicator indicating the voltage droop status of the voltage droop in the supply voltage. The current-starved TLD circuit further comprises a means for selectively starving current supplied to a clock delay circuit in response to the current-starving control indicator indicating the voltage droop status, and a means for generating a delayed clock signal based on a delay of the clock signal in the clock delay circuit based on the means for selectively starving current.

In another aspect, a method of current-starving a TLD circuit in an ACD system is provided. The method comprises receiving a clock signal, receiving a droop indicator indicating a voltage droop status of a voltage droop in a supply voltage, generating a current-starving control indicator in response to the droop indicator indicating the voltage droop status of the voltage droop in the supply voltage, selectively starving current supplied to a clock delay circuit in response to the current-starving control indicator indicating the voltage droop status, and generating a delayed clock signal based on a delay of the clock signal in the clock delay circuit based on the selectively starving current.

In another exemplary aspect, an ACD system for slowing a frequency of a clock signal distributed to a clocked circuit is provided. The ACD system comprises a droop detector circuit configured to detect a voltage droop in a supply voltage at a power rail, and generate a droop indicator indicating a voltage droop status of the voltage droop in the supply voltage, and a current-starved TLD circuit. The current-starved TLD circuit comprises a clock delay circuit comprising a clock input configured to receive a clock signal, and a current-starving circuit. The current-starving circuit comprises a current-starving control circuit configured to generate a current-starving control indicator in response to the droop indicator, and a current supply circuit configured to selectively starve current to the clock delay circuit in response to the current-starving control indicator indicating the voltage droop status of the voltage droop in the supply voltage. The clock delay circuit is configured to generate a delayed clock signal based on a delay of the clock signal based on the selectively starved current.

BRIEF DESCRIPTION OF THE FIGURES

FIG. 11 includes two timing diagrams illustrating exemplary voltage levels of a supply voltage drooping below a first voltage threshold at which current-starving is activated in a current-starved TLD circuit, and exemplary voltage levels of the supply voltage drooping below the first voltage threshold and below a second voltage threshold at which clock division is activated in the clock divider circuit in the ACD circuit in FIG. 4;

FIG. 12 is a block diagram of an exemplary voltage transient monitor (VTM) circuit, wherein the VTM circuit compares a supply voltage to a first voltage threshold for activating current-starving in a current-starved TLD circuit, and compares the supply voltage to a second voltage threshold for activating clock division in a clock divider circuit;

DETAILED DESCRIPTION

Figure 1:
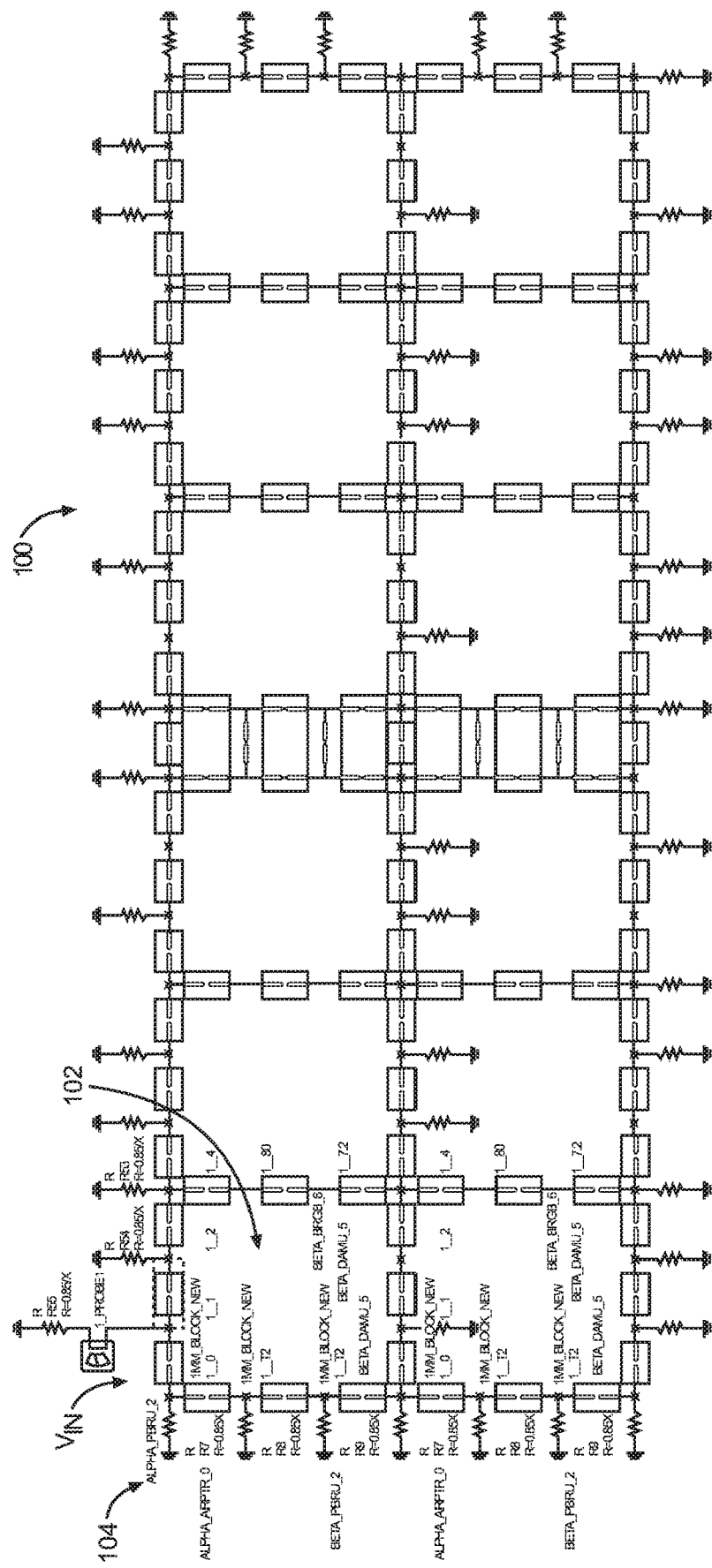
FIG. 1 is a schematic diagram of an exemplary power distribution network (PDN) in a large integrated circuit (IC) chip in which a voltage droop occurs in a corner region.
Figure 2:
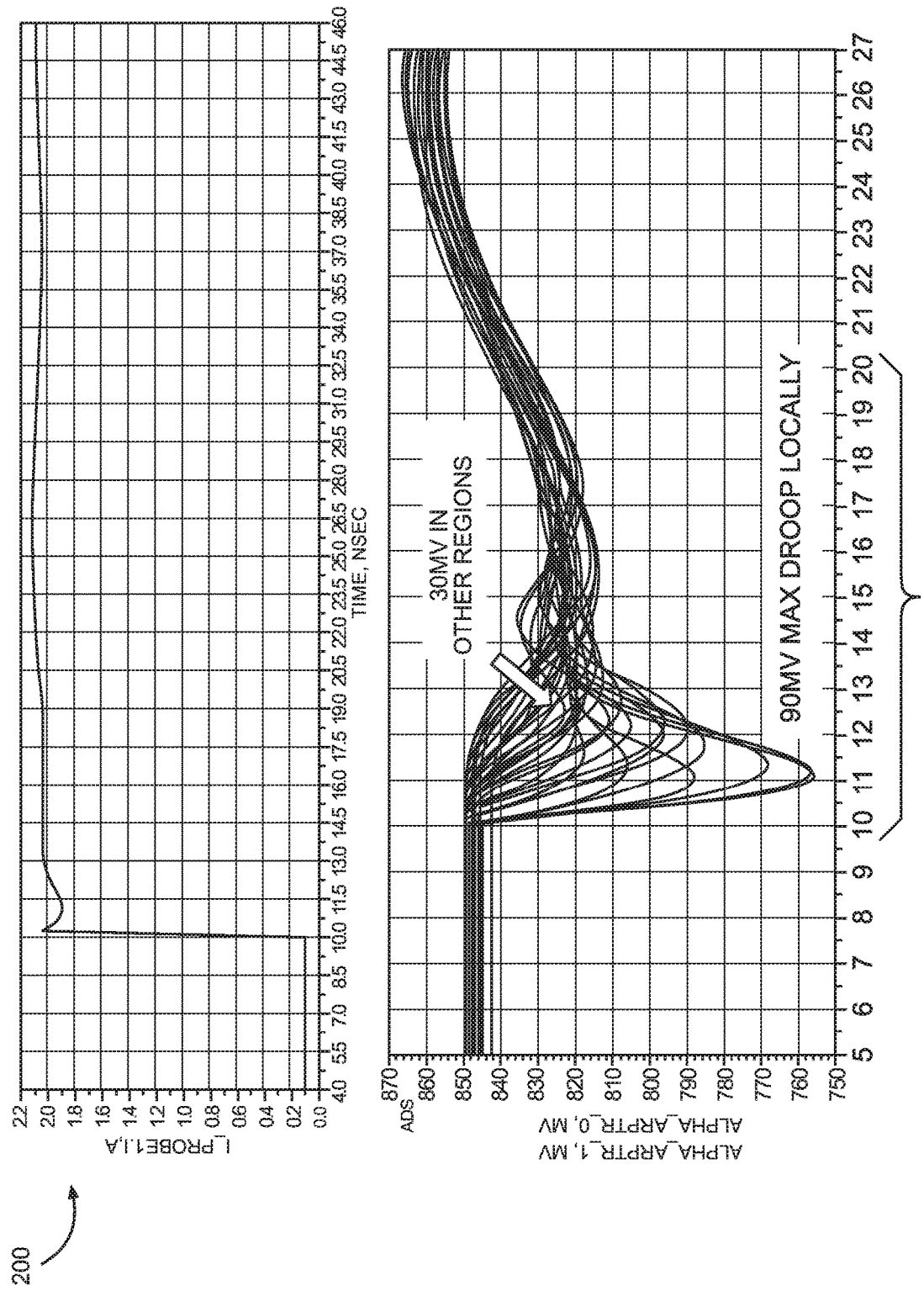
FIG. 2 is a timing diagram of an exemplary current level of a probe signal inducing a current transient event to cause a voltage droop in the corner sector of the power distribution network in FIG. 1, and a timing diagram of exemplary voltage levels at regions of the IC chip in response to the induced current transient event.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include current-starving in tunable-length delay (TLD) circuits employable in adaptive clock distribution (ACD) systems for compensating supply voltage droops in integrated circuits (ICs). A TLD circuit is provided to increase (e.g., stretch) a delay of a clock signal, generally by a few clock cycles, in response to a voltage droop of a supply voltage before the ACD system may respond to the voltage droop to slow down (e.g., divide) the frequency of the clock signal. The ACD system slows down the frequency of the clock signal to avoid timing errors in a clocked circuit (e.g., a CPU) powered by the supply voltage and clocked by the clock signal, because the voltage droop may cause circuits in the clocked circuit to slow down due to a loss in drive strength. In this regard, the TLD circuit delays the clock signal by having a clock delay path formed of logic circuits that experience the same loss in drive strength by being powered by the supply voltage that incurs the voltage droop. However, the TLD circuit may experience less voltage droop than the clocked circuit, such that the TLD circuit does not stretch the clock signal enough to respond to the magnitude of the voltage droop experienced by the clocked circuit. For example, large power distribution networks (PDNs) may have significant impedance, causing a decoupling effect that delays and reduces magnitudes of voltage droops as they travel across a PDN.

In this regard, in exemplary aspects disclosed herein, the TLD circuit is a current-starved TLD circuit that starves clock delay circuits of current in response to an indication of a voltage droop. Starving the clock delay circuits further increases the clock signal delay beyond the delay caused by the reduction in drive strength of the clock delay circuits in the TLD circuit in response to the voltage droop to further stretch the clock period. The further stretching of the clock period caused by the current-starving of the TLD circuit can overcome a difference between the magnitudes of the voltage droops at the TLD circuit in an IC and other areas of the IC where clocked circuits are located. Without current-starving, the magnitude of the voltage droop at the TLD circuit may not sufficiently stretch the clock period to avoid errors in the clocked circuits.

An exemplary ACD system that includes a current-starved TLD circuit with a current-starving circuit configured to stretch (i.e., increase) a delay in a clock delay circuit beyond a delay that may be caused by reduction in drive strength of clock delay circuits in response to a voltage droop is discussed below starting at FIG. 4. Before discussing such an ACD system, an exemplary existing ACD system 300 that does not include a current-starving circuit and is configured to slow down the frequency of a clock signal supplied to a clocked circuit 304 is first discussed with regard to FIG. 3.

Figure 3:
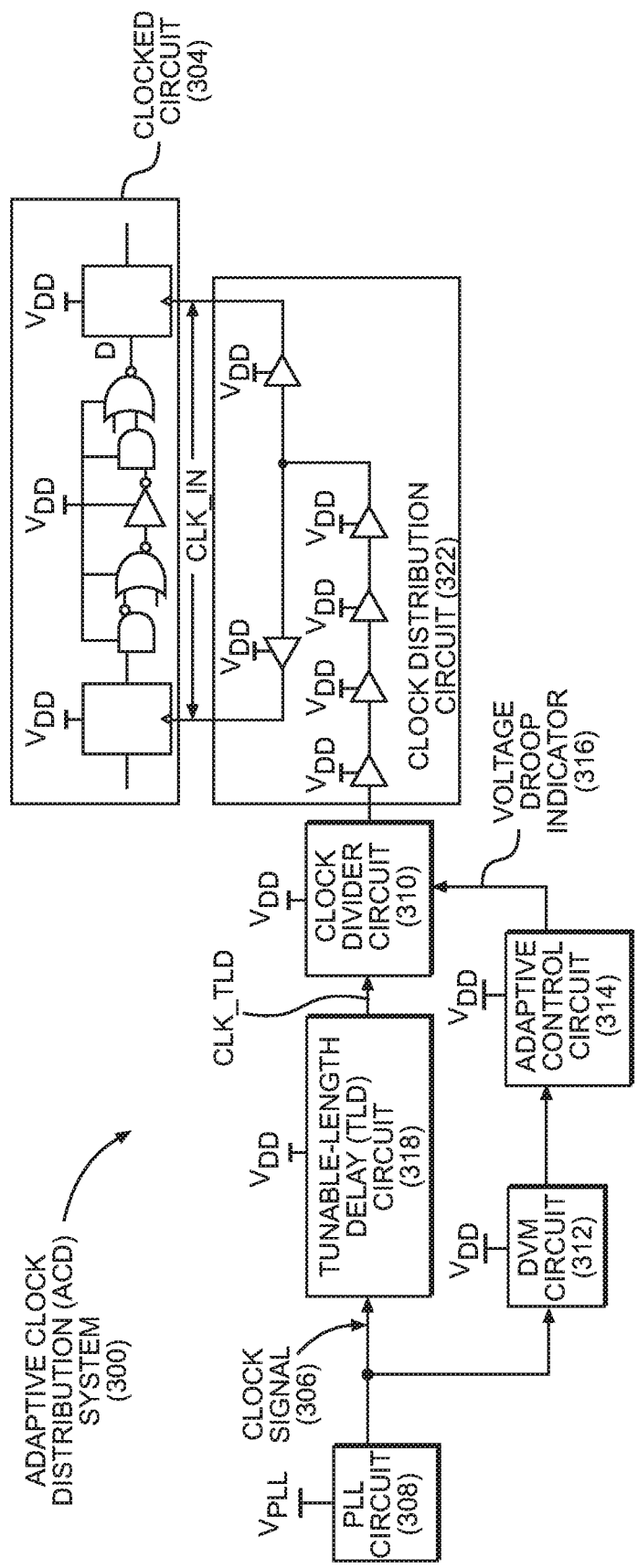
FIG. 3 is a block diagram of an exemplary adaptive clock distribution (ACD) system that includes a dynamic voltage monitor (DVM) circuit configured to detect a voltage droop in a supply voltage, and a tunable-length delay (TLD) circuit configured to stretch a clock signal and a clock divider circuit configured to reduce a clock frequency of the clock signal distributed in a clock distribution network to a clocked circuit powered by the supply voltage.

In this regard, FIG. 3 illustrates an ACD system 300 that is configured to supply a clock signal CLK_IN to the clocked circuit 304. The clock signal CLK_IN supplied to the clocked circuit 304 is based on a clock signal 306 generated in a phase-locked-loop (PLL) circuit 308. The PLL circuit 308 is powered by a voltage $V_{PLL}$ from a different power source than a supply voltage $V_{DD}$ supplied to the ACD system 300 and the clocked circuit 304. Since the voltage $V_{PLL}$ is from a different power source than the supply voltage $V_{DD}$, when the clocked circuit 304 experiences a voltage droop occurring in the supply voltage $V_{DD}$, the PLL circuit 308 may not experience a corresponding voltage droop in the voltage $V_{PLL}$. Thus, in response to a voltage droop in the supply voltage $V_{DD}$, propagation delays in the clocked circuit 304 may increase due to a reduction in drive strength caused by the voltage droop, but the period (i.e., frequency) of the clock signal CLK_IN based on the clock signal 306 supplied by the PLL circuit 308 may not change. In this regard, if propagation delays in the clocked circuit 304 increase, operations of the clocked circuit 304 may not complete within an available time of a clock period of the clock signal CLK_IN, and errors will occur in the clocked circuit 304.

To compensate for the increased delays in the clocked circuit 304 in the presence of a voltage droop in supply voltage $V_{DD}$, the ACD system 300 includes a clock divider circuit 310 to reduce a frequency of the clock signal CLK_IN in response to a voltage droop indication indicating a voltage droop. A dynamic variation monitor (DVM) circuit 312 detects a voltage droop in the supply voltage $V_{DD}$ and an adaptive control circuit 314 provides a voltage droop indicator 316 indicating a voltage droop to the clock divider circuit 310. However, it may take several clock cycles (e.g., 3 or more clock cycles) for the clock divider circuit 310 to respond to the voltage droop to reduce the frequency of the clock signal CLK_IN. Therefore, the ACD system 300 also includes a TLD circuit 318 configured to stretch the period of the clock signal CLK_IN provided to the clocked circuit 304 during the several cycles to compensate for the voltage droop in supply voltage $V_{DD}$ and avoid errors.

The clock signal 306 propagates through the TLD circuit 318 to generate a delayed clock signal CLK_TLD, which is passed through the clock divider circuit 310, through a clock distribution circuit 322, and to the clocked circuit 304. As the voltage droop occurs, the drive strength of the TLD circuit 318 is reduced and the propagation delay through the TLD circuit 318 increases. This increase in propagation through the TLD circuit 318 stretches (i.e., increases) the period of the clock signal 306 to generate the delayed clock signal CLK_TLD that is passed to the clock divider circuit 310 to generate the clock signal CLK_IN. If the TLD circuit 318 experiences the same voltage droop in supply voltage $V_{DD}$ as the clocked circuit 304, the period of the clock signal CLK_IN is stretched enough to compensate for the increased delay in the clocked circuit 304, and errors are thus avoided. However, the TLD circuit 318 may not experience the same voltage droop as the clocked circuit 304, especially if the TLD circuit 318 and the clocked circuit 304 are in a larger IC. A voltage droop in an IC may be caused by a change in a current event (di/dt event) resulting from a sudden current draw by clocked circuits in a CPU, for example. In a larger IC, a large number of CPUs and high speed memory may be integrated, and a power distribution network can be very large. A large power distribution network may have significant impedance through which a large isolated di/dt event (e.g., due to noise) travels. Due to this impedance, noise in one region of the power distribution network is decoupled from other remote regions. As a result, a voltage droop in one region of the power distribution network may be delayed and may decrease in magnitude before arriving in another region of the power distribution network. In this example, the TLD circuit 318 in FIG. 3 may experience a voltage droop having a smaller magnitude than the voltage droop experienced by the clocked circuit 304 in a remote region of a larger IC. As a result, the period of the clock signal CLK_IN may not be sufficiently stretched to avoid errors in the clocked circuit 304.

Figure 4:
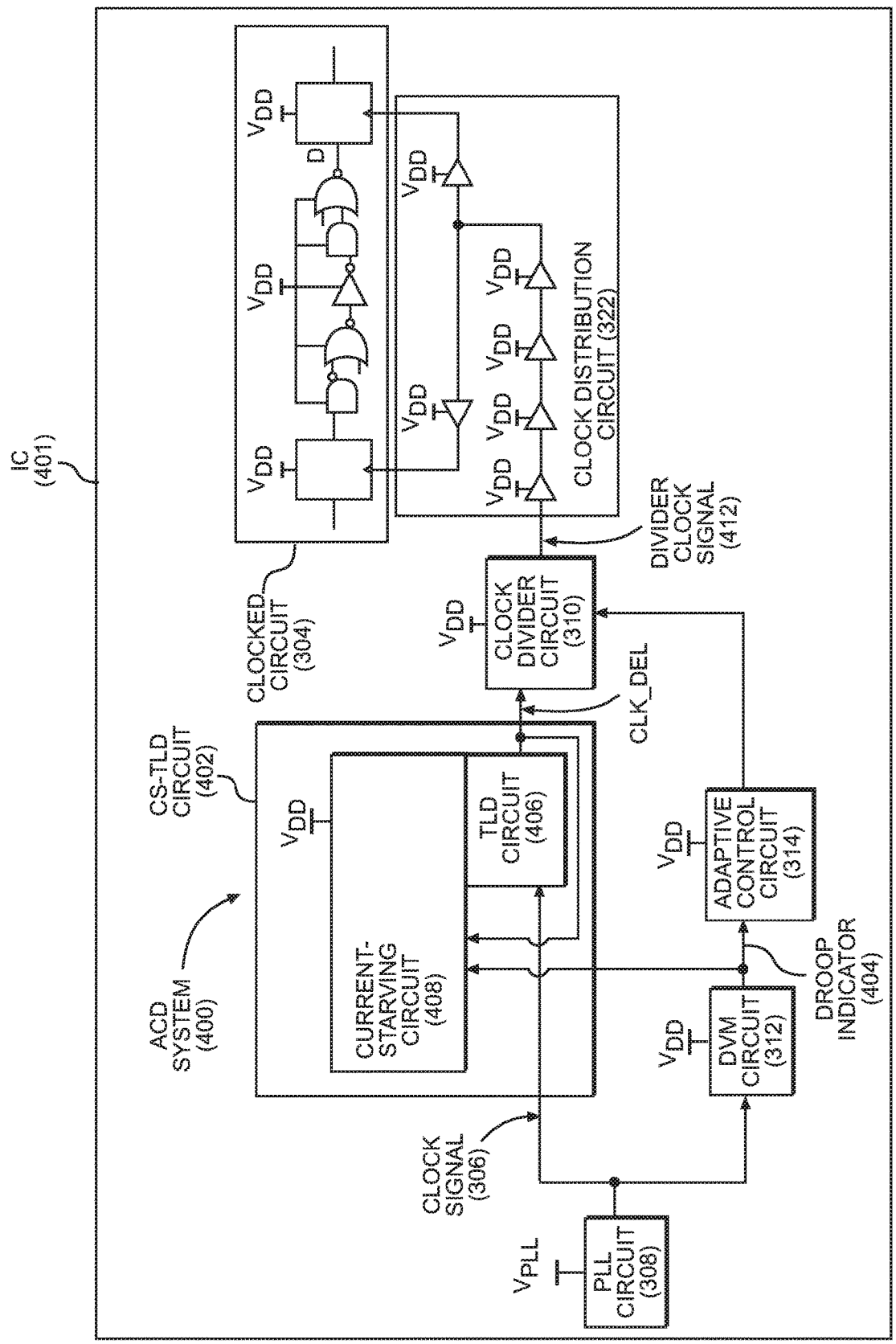
FIG. 4 is a block diagram of an exemplary ACD system that includes a DVM circuit configured to detect a voltage droop, and a clock divider circuit configured to reduce a clock frequency of a clock signal in response to the detected voltage droop, and also includes a current-starved TLD circuit configured to further stretch (i.e., increase) a clock signal delay beyond a delay caused by reduction in drive strength of clock delay circuits in the current-starved TLD circuit in response to the detected voltage droop.

To avoid errors caused by a voltage droop in the clocked circuit 304, an exemplary ACD system 400 in an IC 401 that includes a current-starved TLD (CS-TLD) circuit 402 that is configured to starve clock delay circuits in a TLD circuit in response to an indication of a voltage droop to further increase the clock signal delay beyond the delay caused by the reduction in drive strength of the clock delay circuits in the TLD circuit to further stretch the clock period is shown in FIG. 4. Common circuits and elements between the ACD system 400 in FIG. 4 and the ACD system 300 in FIG. 3 are shown with the same element numbers, and thus will not be re-described with regard to FIG. 4.

With reference to FIG. 4, the current-starved TLD circuit 402 receives a voltage droop indicator 404 (referred to herein as "droop indicator 404") indicating a voltage droop status of a voltage droop in supply voltage $V_{DD}$. For example, the droop indicator 404 can be a signal that can indicate the presence of a voltage droop based on a voltage magnitude. In this example, the voltage droop status of the droop indicator 404 may indicate a voltage droop state or a no voltage droop state, with other states of voltage droop status possible, as discussed below. The current-starved TLD circuit 402 includes a TLD circuit 406 that operates similarly to the TLD circuit 318 of FIG. 3. In addition, the current-starved TLD circuit 402 includes a current-starving circuit 408. In response to the droop indicator 404 indicating a voltage droop status of a voltage droop state in the supply voltage $V_{DD}$, the current-starving circuit 408 restricts the flow of current (i.e., starves current) to the TLD circuit 406. Starving current to the TLD circuit 406 further reduces the drive strength of the TLD circuit 406, thus further increasing the propagation delay of the clock signal 306 through the TLD circuit 406. This further increase in propagation delay will be beyond any increase in delay caused by the voltage droop in supply voltage $V_{DD}$ experienced by the TLD circuit 406 as a result of being powered by the supply voltage $V_{DD}$. A resulting delayed clock signal CLK_DEL is generated by the TLD circuit 406 based on the propagation delay experienced by the clock signal 306 in the TLD circuit 406. The delayed clock signal CLK_DEL is coupled to the clock divider circuit 310 to be divided into a divider clock signal 412 in response to the voltage droop to further decrease the frequency of the delayed clock signal CLK_DEL, which is a further decrease of the frequency of the original clock signal 306. The clock divider circuit 310 is controlled by the adaptive control circuit 314 to reduce a frequency of the divider clock signal 412 that is supplied to the clock distribution circuit 322. In response to the droop indicator 404 indicating a voltage droop, the adaptive control circuit 314 controls the clock divider circuit 310 to divide the delayed clock signal CLK_DEL to generate the divider clock signal 412 having a frequency that is reduced with respect to the frequency of the delayed clock signal CLK_DEL. During the several clock cycles that the clock divider circuit 310 takes to begin dividing the delayed clock signal CLK_DEL, the increased period of the delayed clock signal CLK_DEL, due to the current starving of clock delay circuits (not shown) in the TLD circuit 406, compensates for the increase in delay in the clocked circuit 304 caused by a voltage droop. Thus, the current-starved TLD circuit 402 is configured to compensate for a voltage droop in the clocked circuit 304 even if the current-starved TLD circuit 402 is remote from the clocked circuit 304 in the IC 401 causing the voltage droop experienced by the current-starved TLD circuit 402 to be smaller in magnitude than the voltage droop at the clocked circuit 304. Without current starving, the propagation delay of the clock signal 306 through the clock delay circuits in the TLD circuit 406 would not be sufficiently increased to increase the period of the delayed clock signal CLK_DEL to avoid errors in the clocked circuit 304 before the clock divider circuit 310 can divide the delayed clock signal CLK_DEL to generate the divider clock signal 412 having a reduced frequency.

Figure 5:
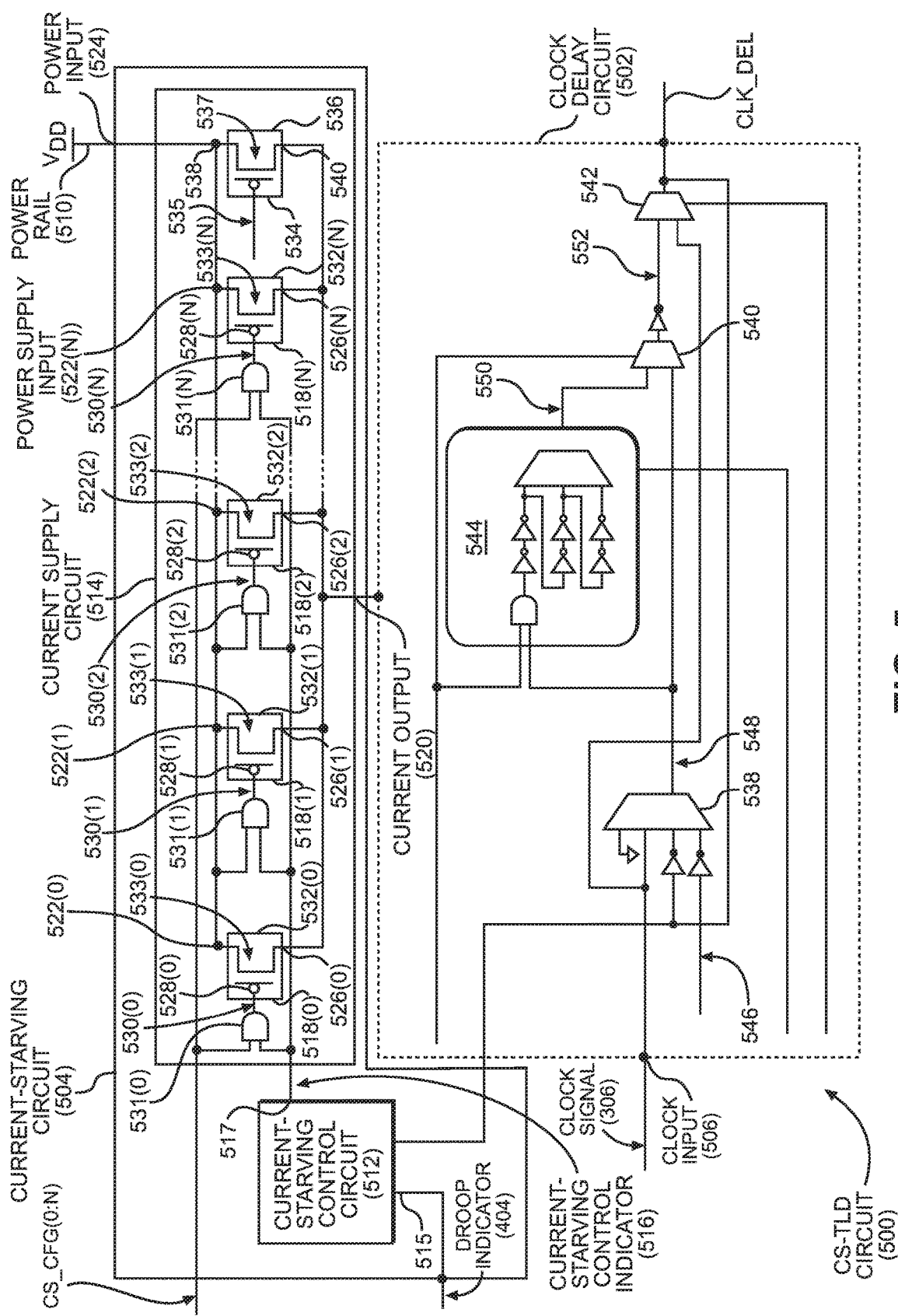
FIG. 5 is a schematic diagram of an exemplary current-starved TLD circuit that can be included in the ACD system in FIG. 4, wherein the current-starved TLD circuit includes a current-starving circuit configured to further stretch (i.e., increase) clock signal delay beyond a delay caused by the reduction in drive strength of the clock delay circuits in the TLD circuit in response to the voltage droop to further stretch the clock period in response to a detected voltage droop.

Further details of one example of a current-starved TLD circuit that can be provided as the current-starved TLD circuit 402 in FIG. 4 are shown in an exemplary current-starved TLD circuit 500 in FIG. 5. In this regard, the current-starved TLD circuit 500 includes a clock delay circuit 502. The clock delay circuit 502 is configured to receive the clock signal 306 at a clock input 506 and generate the delayed clock signal CLK_DEL. The current-starved TLD circuit 500 also includes a current-starving circuit 504. The current-starving circuit 504 is coupled between a power rail 510 configured to receive a supply voltage $V_{DD}$ and the clock delay circuit 502. The current-starving circuit 504 employs a current-starving control circuit 512, and a current supply circuit 514 that is configured to supply or starve current to the clock delay circuit 502. The current-starving control circuit 512 generates a current-starving control indicator 516 to control the current supply circuit 514. The current-starving control indicator 516 is generated to indicate a current-control status in one of a plurality of states. A state of the current-control status may be set by the current-starving control circuit 512 in response to the voltage droop status indicated by the droop indicator 404. For example, in response to the droop indicator 404 indicating the voltage droop status of no voltage droop state (i.e., in the absence of a voltage droop), the current-starving control indicator 516 may be generated to indicate a current-control status in a current supply state. When the current supply circuit 514 receives the current-starving control indicator 516 indicating a current-control status in the current-supply state, the current supply circuit 514 supplies current to the clock delay circuit 502. In response to the droop indicator 404 indicating the voltage droop status of the voltage droop state (i.e., in the presence of a voltage droop), the current-starving control indicator 516 may be generated to indicate the current-control status in a current starve state. When the current supply circuit 514 receives the current-starving control indicator 516 indicating a current-control status in the current starve state, the current supply circuit 514 starves the clock delay circuit 502 of the supply of current. The current-starving control circuit 512 is configured to receive the droop indicator 404 at a droop indicator input 515 and to generate the current-starving control indicator 516 on a current-starving control output 517.

The current supply circuit 514 in this example employs a plurality of (N+1) current paths 518(0)-518(N) to selectively supply current to the clock delay circuit 502 on a current output 520 based on a state of the current-control status indicated by the current-starving control indicator 516. The plurality of current paths 518(0)-518(N) may provide selectable parallel current paths from the power rail 510 to the clock delay circuit 502, with each of the current paths capable of supplying current. In this manner, a total amount of current supplied to the clock delay circuit 502 from the power rail 510 may be programmed to different levels by controlling a number of the plurality of current paths 518(0)-518(N) that supply current. Each current path 518(0)-518(N) includes a power supply input 522 coupled to a power input 524 of the current-starving circuit 504, and a power output 526(0)-526(N) coupled to the current output 520 of the current-starving circuit 504. The current output 520 provides a supply voltage $V_{CS}$ to the clock delay circuit 502. Each of the plurality of current paths 518(0)-518(N) has a control input 528(0)-528(N) configured to receive a respective one of a plurality of current path control signals 530(0)-530(N). The plurality of current path control signals 530(0)-530(N) is generated by a plurality of logical AND circuits 531(0)-531(N). The plurality of current path control signals 530(0)-530(N) is generated based on the current-control status indicated by the current-starving control indicator 516 and a current-starving configuration signal CS_CFG(0:N). For example, current path control signal 530(0) may be generated by the logical AND circuit 531(0) which receives the current-starving configuration signal CS_CFG(0) and the current-starving control indicator 516. For example, the current-starving control indicator 516 may be a multi-bit binary signal and a single bit of the current-starving control indicator 516 may be logically ANDed with the current-starving configuration signal CS_CFG(0). In this way, the current-starving configuration signal CS_CFG(0:N) can be used to enable certain ones of the plurality of current paths 518(0)-518(N) to be controlled by the current-starving control indicator 516 to supply current to the clock delay circuit 502.

In response to the current-control status indicated by the current-starving control indicator 516 being in the current starve state, and assuming all current paths 518(0)-518(N) are enabled by the current-starving configuration signal CS_CFG(0:N), the current path control signals 530(0)-530(N) seen at the control inputs 528(0)-528(N) of the plurality of current paths 518(0)-518(N) may cause the current supply circuit 514 to starve current to the clock delay circuit 502 by decoupling the power supply input 522 of at least one of the plurality of current paths 518(0)-518(N) from the respective power output 526. In one example, the current supply circuit 514 decouples the power supply input 522 of each of the plurality of current paths 518(0)-518(N) from their respective power output 526 in response to the current-control status being in the current starve state. The number of current paths 518(0)-518(N) used to supply current to the clock delay circuit 502 determines a total amount of current flow supplied to the clock delay circuit 502 from the power rail 510. A propagation delay of the clock signal 306 through the clock delay circuit 502 to the delayed clock signal CLK_DEL depends on the magnitude of the supply voltage $V_{DD}$ at the power rail 510, and the total amount of current supplied to the clock delay circuit 502. In this regard, the current-starving configuration signal CS_CFG(0:N) may be used, for example, to calibrate the total amount of current provided to the clock delay circuit 502 by the current-starving circuit 504 by enabling certain ones of the plurality of current paths 518(0)-518(N). In addition, selective control of the plurality of current paths 518(0)-518(N) allows the current-starving control circuit 512 to control levels of current supplied to the clock delay circuit 502 in response to changes in the voltage droop status indicated by the droop indicator 404. Controlling levels of the current supply to the clock delay circuit 502 is discussed in more detail below.

With continuing reference to FIG. 5, switches 532(0)-532(N) are employed in the current paths 518(0)-518(N) in this example to control the current-starving control circuit 512 to selectively supply current from the respective power supply input 522 to the respective power output 526 in a respective current path 518(0)-518(N) based on the current path control signals 530(0)-530(N). The switches 532(0)-532(N) may be implemented by P-type metal-oxide semiconductor (MOS) field-effect transistors (FETs) (MOSFETs) (PFETs) 533(0)-533(N), but other transistors are possible. In addition to the plurality of current paths 518(0)-518(N), the current supply circuit 514 also includes a base current path 534 from the power input 524 to the current output 520. The base current path 534 may be configured as a short circuit between the power input 524 and the current output 520, such that the base current path 534 always supplies current to the clock delay circuit 502. The base current path 534 may be configured as a short circuit to supply a minimum amount of current necessary for operation of the clock delay circuit 502. Alternatively, the base current path 534 may be a switch 536 with a base current control input 535 that is activated separately from the current path control signals 530(0)-530(N). The switch 536 may also be implemented by a PFET 537, or another type of transistor. Power consumption may be reduced by supplying no current to the clock delay circuit 502 when the clock delay circuit 502 is bypassed, as discussed below. The base current path 534 includes a power supply input 538 coupled to the power input 524 of the current-starving circuit 504, and a power output 540 coupled to the current output 520 of the current-starving circuit 504.

As previously discussed, the clock delay circuit 502 generates the delayed clock signal CLK_DEL having a delay with respect to the clock signal 306, with the delay based on the selected level of current supplied by the current supply circuit 514, and also based on a magnitude of the supply voltage $V_{DD}$ supplied to the clock delay circuit 502 in the presence of a voltage droop. In addition, the clock delay circuit 502 is configured to provide alternative sources for generating the delayed clock signal CLK_DEL, other than the clock signal 306. The clock delay circuit 502 includes a source multiplexer (MUX) 538, an enable MUX 540, a bypass MUX 542, and a tunable delay path 544. The source MUX 538 may be used to select among a plurality of clock inputs (not shown) including the clock signal 306, a feedback path of the delayed clock signal CLK_DEL, or an alternate clock signal 546 supplied to the clock delay circuit 502, as non-limiting examples, to generate a selected clock signal 548. The tunable delay path 544 receives the selected clock signal 548 which, if enabled, propagates through a delay path having a tunable length to generate an internal delayed clock signal 550. The enable MUX 540 may be employed to select from among the selected clock signal 548 and the internal delayed clock signal 550 to generate an enabled clock signal 552. The bypass MUX 542 may be employed to generate the delayed clock signal CLK_DEL by selecting the enabled clock signal 552, or selecting the clock signal 306 that is supplied to the clock delay circuit 502 to bypass the source MUX 538, the tunable delay path 544, and the enable MUX 540. In the current-starved TLD circuit 500 in FIG. 5, the current-starving control circuit 512 employs the switches 532 to starve current to the clock delay circuit 502 based on a voltage droop state of a voltage droop status indicated by the droop indicator 404. Starving current to the clock delay circuit 502 further reduces the drive strength of the tunable delay path 544, thus further increasing the propagation delay of the selected clock signal 548 through the clock delay circuit 502 beyond any delay caused by the reduction in drive strength of the tunable delay path 544 due to a voltage droop in the supply voltage $V_{DD}$ supplied to the clock delay circuit 502, and further increasing the clock period.

Figure 6:
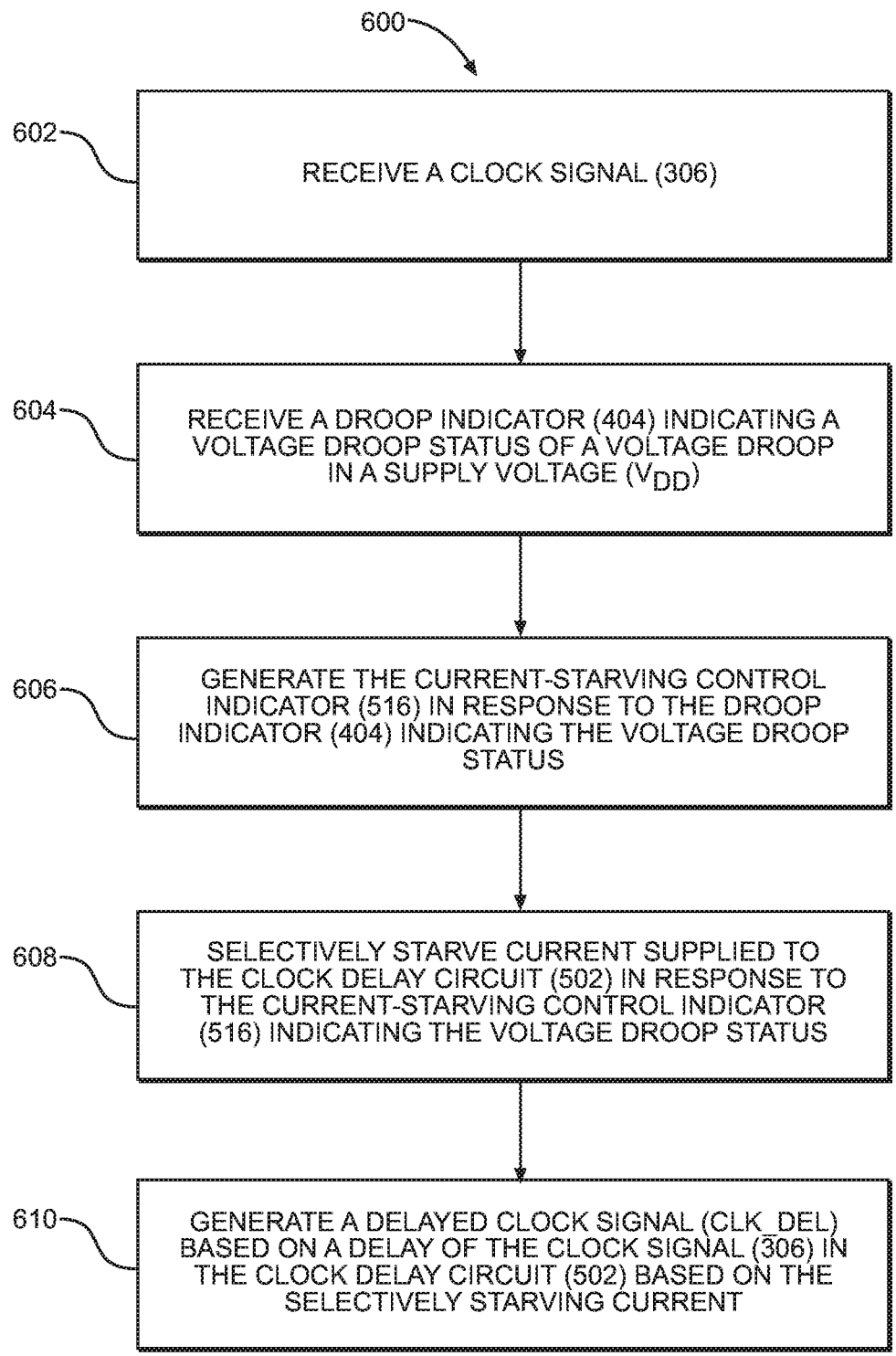
FIG. 6 is a flowchart illustrating an exemplary process of the current-starved TLD circuit in the ACD system of FIG. 4, further stretching (i.e., increasing) a clock signal delay beyond a delay caused by reduction in drive strength of the clock delay circuits in the current-starved TLD circuit in response to the detected voltage droop.

In another aspect, a method 600 of current-starving the current-starved TLD circuit 500 of FIG. 5 is disclosed in FIG. 6. The method 600 includes receiving a clock signal 306 (block 602), and receiving a droop indicator 404 indicating a voltage droop status of a voltage droop in the supply voltage $V_{DD}$ (block 604). The method 600 includes generating the current-starving control indicator 516 in response to the droop indicator 404 indicating the voltage droop status (block 606). The method 600 includes selectively starving current supplied to the clock delay circuit 502 in response to the current-starving control indicator 516 indicating the voltage droop status (block 608). The method 600 also includes generating a delayed clock signal CLK_DEL based on a delay of the clock signal 306 in the clock delay circuit 502 based on the selectively starving current (block 610).

Figure 7:
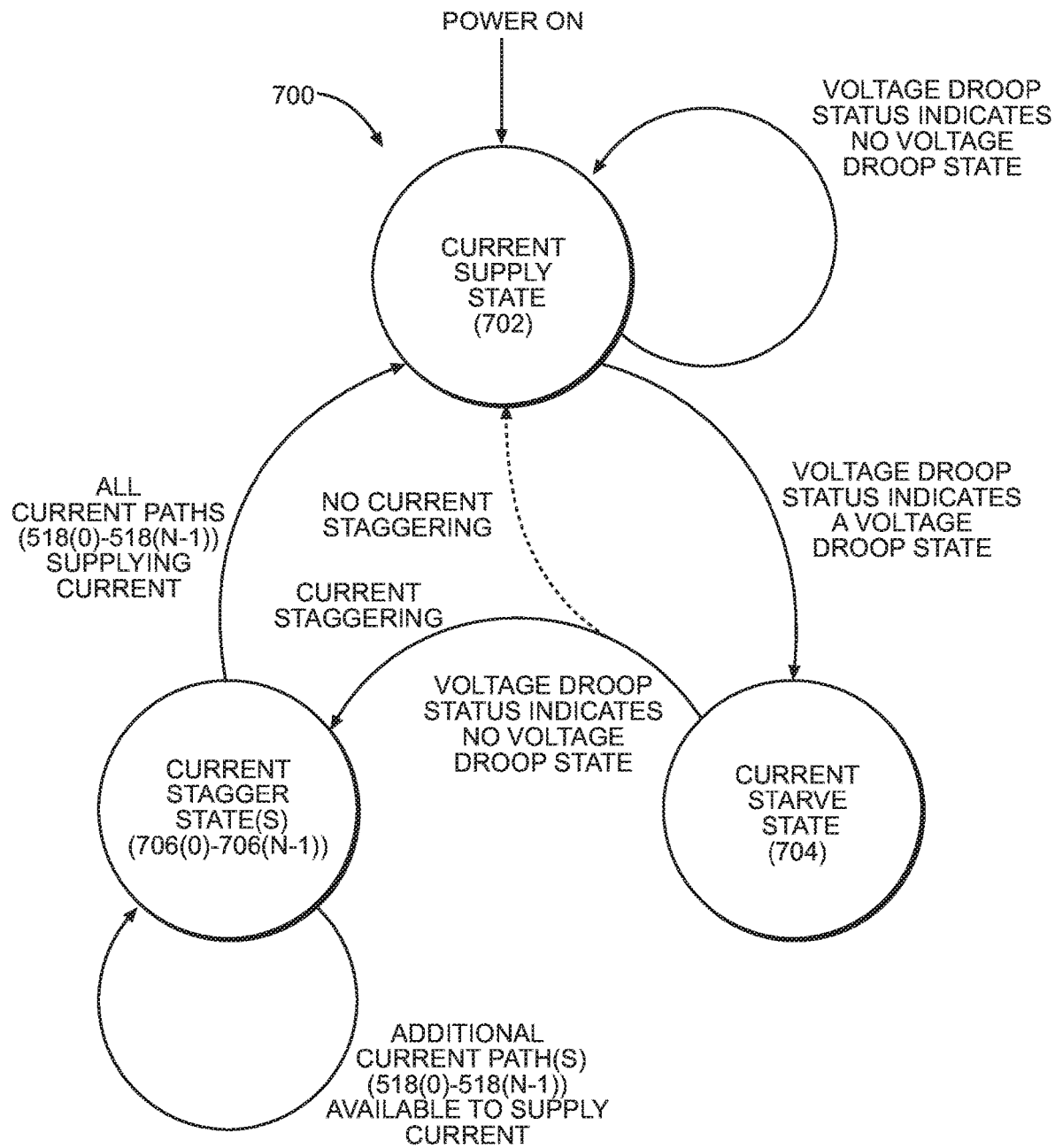
FIG. 7 is a state diagram of exemplary states of a current-starving control circuit in the current-starved TLD circuit of FIG. 5, wherein the clock delay circuits in the current-starved TLD circuit are starved of current based on a current-starving control signal based on a voltage droop.

In another aspect, exemplary states of the current-starving control circuit 512 in the current-starving circuit 504 of FIG. 5, are illustrated in and described with reference to a state diagram 700 in FIG. 7. The states of the current-starving control circuit 512 illustrated in FIG. 7 correspond to states of the current-control status indicated by the current-starving control indicator 516. Following power on, the current-starving control circuit 512 enters a current supply state 702. In the current supply state 702, the current-starving control circuit 512 generates the current-starving control indicator 516 to indicate a current-control status of the current supply state 702, as discussed in regard to FIG. 5. In the current supply state 702, all of the current paths 518(0)-518(N) in FIG. 5 may supply current to the clock delay circuit 502 so that no increase in delay of the clock signal 306 is caused by current starving. The current-starving control circuit 512 remains in the current supply state 702 as long as no voltage droop is detected. In other words, as long as the droop indicator 404 indicates a voltage droop status indicating no voltage droop state, the current-starving control circuit 512 remains in the current supply state 702, so the current-control status of the current-starving control indicator 516 does not cause the current supply circuit 514 to starve current to the clock delay circuit 502.

In response to the droop indicator 404 having a voltage droop status indicating a voltage droop, the current-starving control circuit 512 enters a current starve state 704. In the current starve state 704, the current-starving control circuit 512 generates the current-starving control indicator 516 to indicate the current starve state 704 of the current-control status, as discussed in regard to FIG. 5. In response to the current starve state 704, the current supply circuit 514 employs switches 532 in the plurality of current paths 518(0)-518(N) to starve current to the clock delay circuit 502. For example, in response to the current-starving control circuit 512 being in the current starve state 704, the switches 532 in the plurality of current paths 518(0)-518(N) are opened to decouple the respective power supply input 522 from the respective power output 526 to further increase the delay of the clock signal 306 in the clock delay circuit 502, as described above. In another aspect, in the current starve state 704, it may be sufficient to open less than all of the switches 532 to provide a particular current level to attain a desired further increase in delay of the clock signal 306. For example, the number of switches 532 to be opened in the current starve state 704 may depend on a total number and a current capacity of each of the available switches 532. The total number of available switches 532 may be controlled by the current-starving configuration signal CS_CFG(0:N), and may be determined, for example, by a calibration process. In this aspect, the switches 532 in at least one of the current paths 518(0)-518(N) are employed to decouple the respective power supply input 522 from the respective power output 526. Although four (4) current paths 518(0)-518(N) are shown in the plurality of current paths 518(0)-518(N-1), more or less than four (4) are possible. In either aspect, the base current path 534 may continue to supply current to the clock delay circuit 502. In response to the droop indicator 404 again indicating a voltage droop status of no voltage droop state when the voltage droop has ended, the current-starving control circuit 512 exits the current starve state 704.

As noted above, the current-starving control circuit 512 enters the current starve state 704 in response to the droop indicator 404 indicating a voltage droop status of a voltage droop state. In addition, the clock divider circuit 310 is triggered to reduce the clock period of the divider clock signal 412 after several cycles (e.g., 3 cycles). When the voltage droop ends, if the current-starving circuit 504 suddenly stops starving current to the clock delay circuit 502, the period of the delayed clock signal CLK_DEL becomes compressed until the clock periods of the delayed clock signal CLK_DEL are synchronized to the clock periods of the clock signal 306. Thus, the compressed clock periods of the delayed clock signal CLK_DEL would be shorter than the propagation delay in the clocked circuit 304, which could cause errors to occur. However, since the clock divider circuit 310 reduces the frequency of the delayed clock signal CLK_DEL to generate the divider clock signal 412 after several cycles, compression of the period of the delayed clock signal CLK_DEL is offset, so the period of the clock signal CLK_IN to the clocked circuit 304 shown in FIG. 3 does not become small enough to cause errors. Consequently, the current-starving control circuit 512 may return directly from the current starve state 704 to the current supply state 702, and generate the current-starving control indicator 516 indicating the current supply state 702 of the current-control status. In this aspect, the current paths 518(0)-518(N) may again be employed to supply current to the clock delay circuit 502. After the propagation delay through the clock delay circuit 502 returns to a delay prior to the voltage droop, the clock divider circuit 310 will stop dividing the delayed clock signal CLK_DEL so the frequency of the divider clock signal 412 will return to the frequency of the clock signal 306.

However, if the clock divider circuit 310 does not reduce the frequency of the delayed clock signal CLK_DEL to generate the divider clock signal 412, errors may occur in the clocked circuit 304 when the current starve state 704 is exited and all of the current paths 518(0)-518(N) are suddenly employed to supply current to the clock delay circuit 502. For example, if the droop indicator 404 indicates a voltage droop status of a voltage droop state for less than 3 cycles of the delayed clock signal CLK_DEL, the divider clock signal 412 generated by the clock divider circuit 310 may not be reduced before the voltage droop has ended. In this regard, a sudden compression of the period of the delayed clock signal CLK_DEL would not be offset by a division of the delayed clock signal CLK_DEL, and the sudden compression would result in a reduction of the period of the clock signal CLK_IN, causing errors in the clocked circuit 304 in FIG. 3. To avoid such sudden compression, the current-starving control circuit 512 may enter one of current stagger states 706(0)-706(N-1) in response to the droop indicator 404 indicating a voltage droop status of no voltage droop state. In the current stagger states 706(0)-706(N-1), the current-starving control circuit 512 incrementally increases the current supplied to the clock delay circuit 502. For example, the current-starving control circuit 512 initially generates the current-starving control indicator 516 to indicate a current-control status corresponding to a first current stagger state 706(0). In response, the current supply circuit 514 couples the power supply input 522 of a first current path 518(0) of the plurality of current paths 518(0)-518(N) to the power output 526 of the first current path 518(0). The current-starving control circuit 512 may remain in the first current stagger state 706(0) for a duration of time, such as at least one cycle of the delayed clock signal CLK_DEL, or for several cycles, to allow the propagation delay through the clock delay circuit 502 to adjust to the increased current supply level. The current-starving control circuit 512 determines if there is another current path 518(1)-518(N−1) available to supply current to the clock delay circuit 502 and, if so, the current-starving control circuit 512 enters a second current stagger state 706(1) at the end of the duration of the first current stagger state 706(0). In the second current stagger state 706(1), the current-starving control circuit 512 generates the current-starving control indicator 516 to indicate a current-control status corresponding to the second current stagger state 706(1). In response to such current-control status, the current supply circuit 514 couples the power supply input 522 of a second current path 518(1) of the plurality of current paths 518(0)-518(N) to the power output 526 of the second current path 518(1). As in the first current stagger state 706(0), the current-starving control circuit 512 may remain in the second current stagger state 706(1) for the duration of time, such as one or more cycles of the delayed clock signal CLK_DEL, to allow the propagation delay through the clock delay circuit 502 to adjust to the increased current supply level. Additional current paths 518(2)-518(N−1), if available, may be consecutively employed in subsequent current stagger states 706(2)-706(N−1) in which the amount of current supplied to the clock delay circuit 502 is incrementally increased with each consecutive employment of a current path 518(2)-518(N−1). The delayed clock signal CLK_DEL is provided to the current-starving control circuit 512 so the duration of time during which the current-starving control circuit 512 remains in one of the current stagger states 706(0)-706(N−1) may be based on a predetermined number of clock periods of the delayed clock signal CLK_DEL.

Figure 8:
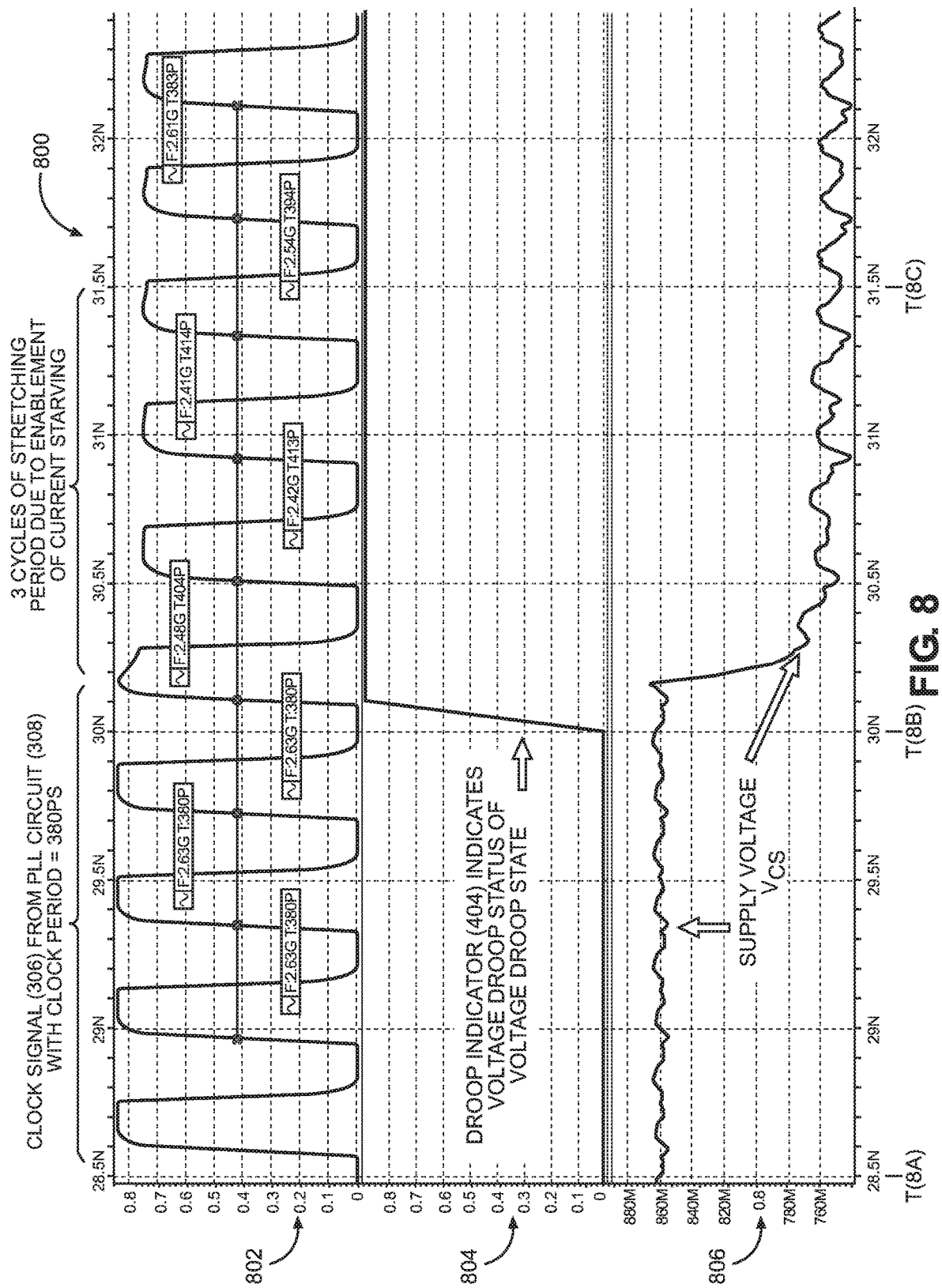
FIG. 8 is a timing diagram illustrating exemplary voltage levels of a clock signal stretched in a current-starved TLD circuit in response to a detected voltage droop, and exemplary voltage levels of a supply voltage to the current-starved TLD circuit in response to current-starving.

FIG. 8 is a timing diagram 800 showing exemplary voltage levels in the current-starved TLD circuit 500 in FIG. 5. In an upper section 802 of the timing diagram 800 in FIG. 8, exemplary levels of the delayed clock signal CLK_DEL are illustrated. In a middle section 804, FIG. 8 shows exemplary voltage levels of the droop indicator 404. In a lower section 806, FIG. 8 shows voltage levels of the supply voltage $V_{is}$ on the current output 520 supplied to the tunable delay path 544 in the clock delay circuit 502 From time T(8A) to time T(8B), the droop indicator 404 indicates a no voltage droop state. In response to the droop indicator 404 indicating a voltage droop status indicating a voltage droop state, at approximately time T(8B), the current-starving control circuit 512 generates the current-starving control indicator 516 indicating the current starve state 704. As a result, the current supply circuit 514 starves current to the clock delay circuit 502. In the lower section 806, FIG. 8 shows that the supply voltage $V_{DD}$ levels in the clock delay circuit 502 are significantly reduced as a result of the current-starving. As shown in the upper section 802, the clock period is stretched (i.e., increased) due to the current-starving during the first three (3) cycles after indication of the voltage droop (i.e., approximately time T(8B) to time T(8C) in FIG. 8) from approximately 380 picoseconds (ps) to approximately 413 ps, in this example.

Figure 9:
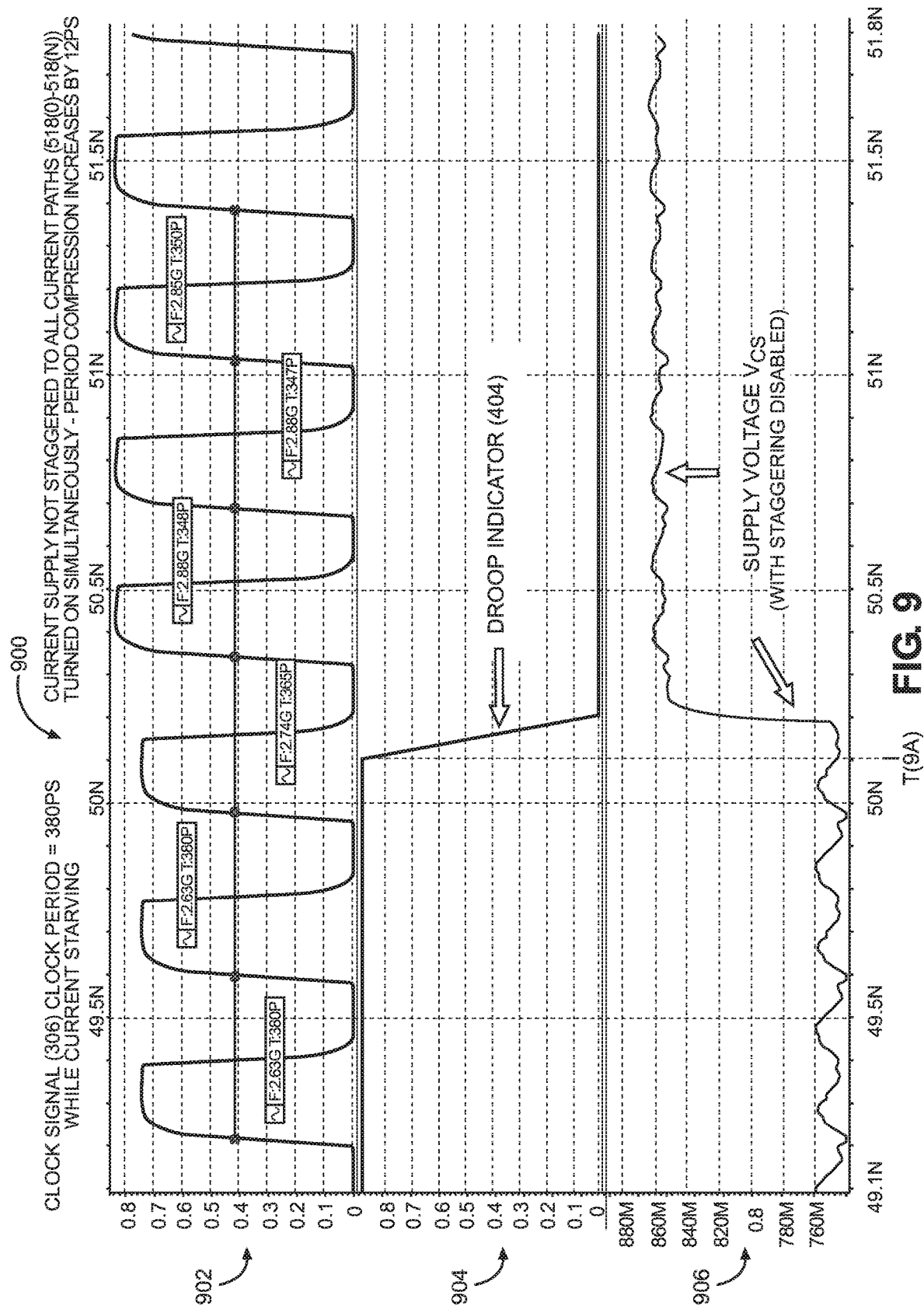
FIG. 9 is a timing diagram illustrating exemplary voltage levels of a clock signal in a current-starved TLD circuit compressed over a few clock periods as the current-starved TLD circuit discontinues current-starving of the clock signal, and exemplary levels of the supply voltage at the current-starved TLD circuit as current supply is restored in response to the voltage droop no longer being detected.

FIG. 9 is a timing diagram 900 showing exemplary voltage levels of the current-starved TLD circuit 500 in FIG. 5. An upper section 902, a middle section 904, and a lower section 906 of the timing diagram 900 in FIG. 9 show exemplary levels of the same voltages shown in the upper, middle and lower sections 802, 804, and 806, respectively, in the timing diagram 800 in FIG. 8, as the droop indicator 404 transitions at time T(9A) from indicating a voltage droop status indicating a voltage droop to indicating a voltage droop status indicating a no voltage droop state. In response to the droop indicator 404 indicating the voltage droop status indicating a no voltage droop state, the current-starving control circuit 512 generates the current-starving control indicator 516 indicating the current supply state 702. In response, the current supply circuit 514 employs each of the plurality of current paths 518(0)-518(N) to supply current to the clock delay circuit 502. As shown in the lower section 906 of FIG. 9, the exemplary levels of the supply voltage $V_{CS}$ on the current output 520 provided to the clock delay circuit 502 increase, and the period of the delayed clock signal CLK_DEL, shown in the upper section 902 of FIG. 9, decreases (e.g., from approximately 380 ps to approximately 348 ps), in response to the supply of current in the example shown.

Figure 10:
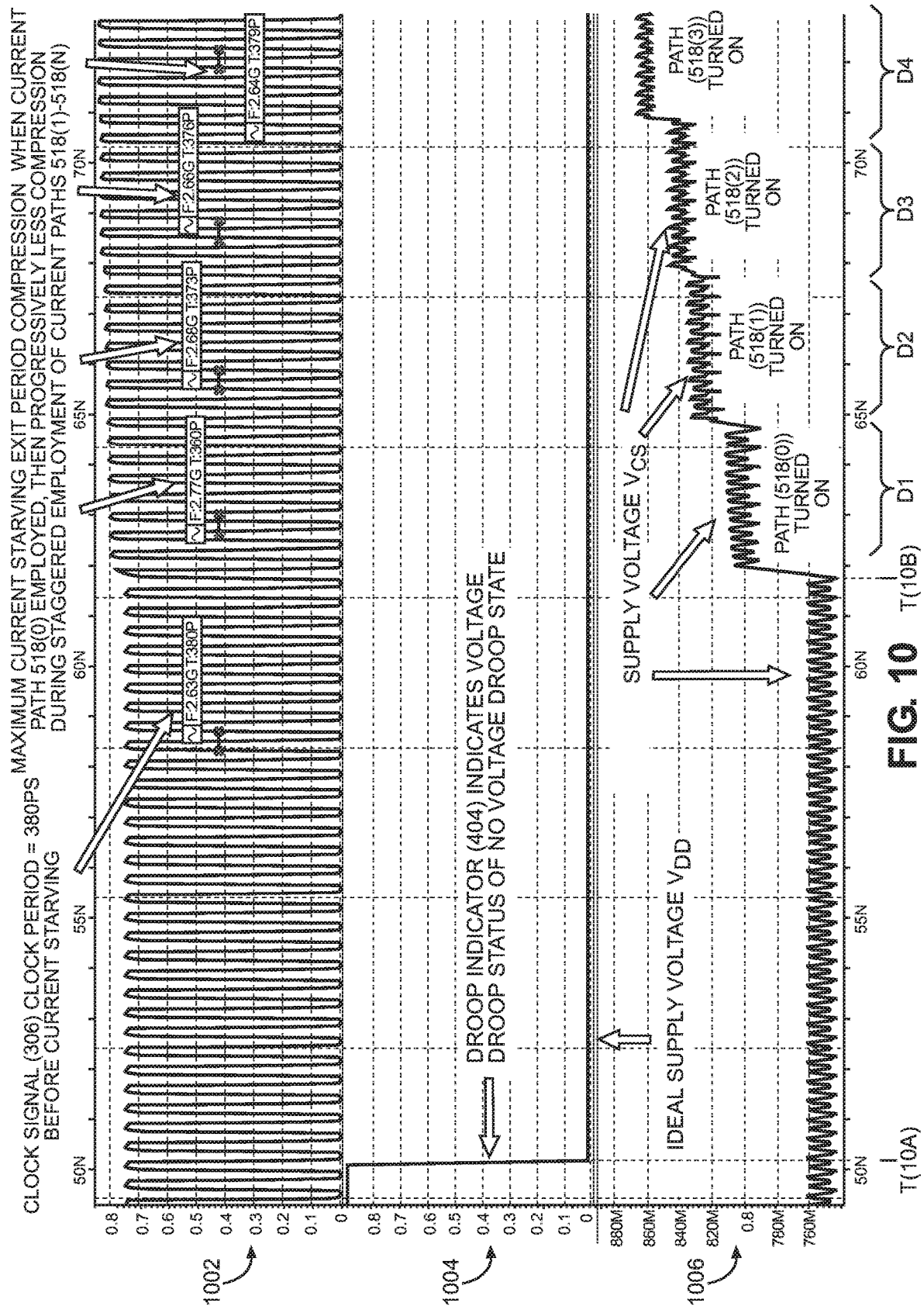
FIG. 10 is a timing diagram illustrating exemplary voltage levels of a clock signal in a current-starved TLD circuit compressed over several clock periods as the current-starved TLD circuit discontinues current-starving of the clock signal, and exemplary levels of a supply voltage at the current-starved TLD circuit as the current supply is restored in response to the voltage droop no longer being detected.

As discussed above, with regard to FIG. 7, when exiting the current starve state 704, the increase of the amount of current supplied to the clock delay circuit 502 may be staggered. The staggered increase in current is illustrated in and discussed in detail with reference to FIG. 10. FIG. 10 is a timing diagram 1000 having an upper section 1002, a middle section 1004, and a lower section 1006 corresponding to sections 902, 904, and 906, respectively, of FIG. 9, showing exemplary voltage levels in the current-starved TLD circuit 500. However, FIG. 10 shows an aspect in which the voltage droop status of the droop indicator 404 transitions (time T(10A)) from indicating a voltage droop to indicating a no voltage droop state. At time T(10B), the current-starving control circuit 512 generates the current-starving control indicator 516 indicating a first current stagger state 706(0), and the current supply circuit 514 employs a first one of the plurality of current paths 518(0)-518(N) to supply current to the clock delay circuit 502. The time during which only a first current path 518(0)-518(N) is employed to supply current to the clock delay circuit 502 is shown as duration D1. After duration D1, a first one of the current paths 518(0)-518(N) is employed. At the end of the duration D1, if the current-starving control circuit 512 determines that another one of the current paths 518(0)-518(N) is available to supply current to the clock delay circuit 502, the current-starving control circuit 512 generates the current-starving control indicator 516 indicating a state of the current-control status corresponding to the second current stagger state 706(1) for duration D2. In the example in FIG. 10, additional current paths 518(0)-518(N) are consecutively employed during durations D3 and D4. Durations D1-D4 may be determined, in one non-limiting example, by a number of clock periods of the delayed clock signal CLK_DEL, which is provided to the current-starving control circuit 512, as discussed above. Other methods for determining durations between consecutive employments of respective current paths 518(0)-518(N) are possible.

FIG. 11 includes timing diagrams 1100(a) and 1100(b) illustrating exemplary voltage levels of a supply voltage $V_{DD}$ experienced at a droop detector circuit, such as a VTM 1200 in FIG. 12, during a Noise Scenario 1 and a Noise Scenario 2, respectively. In the timing diagram 1100(a), the voltage level of the supply voltage $V_{DD}$ is initially at a voltage level of 0.5V with no voltage droop. At time T(11A) the voltage level of supply voltage $V_{DD}$ droops below an exemplary first voltage threshold of 0.35V, and remains below the first voltage threshold until time T(11B) at which time the voltage level of supply voltage $V_{DD}$ rises above 0.35V and returns to 0.5V. A comparator 1202 in the VTM 1200 in FIG. 12 is configured to compare the voltage level of the supply voltage $V_{DD}$ on a supply voltage input 1203 to an analog voltage 1204, and generate a first threshold indication DROOP_HIGH on a droop detector output 1206. The analog voltage 1204 is generated by a digital-to-analog circuit (DAC) 1208 that receives digital voltage information 1210. In a first example, the droop indicator 404 is generated based on the droop detector output 1206 of the comparator 1202, and both of the current-starved TLD circuit 500 and the clock divider circuit 310 receive the droop indicator 404 indicating a voltage droop status indicating a voltage droop in the voltage level of supply voltage $V_{DD}$ below the first voltage threshold. In the first example, the current-starved TLD circuit 500 starves current to the clock delay circuit 502, as described above, and the clock divider circuit 310 is triggered to reduce a clock frequency of the delayed clock signal CLK_DEL. The timing diagrams 1100(*a*) and 1100(*b*) also show a second (lower) voltage threshold. In timing diagram 1100(*a*), the voltage level of supply voltage $V_{DD}$ did not droop below the second voltage threshold, but in timing diagram 1100(*b*), the voltage level of the supply voltage $V_{DD}$ drops below the first voltage threshold at time T(11C) below the second voltage threshold at time T(11D) returns to a voltage level above the second voltage threshold at time T(11E) and returns to a voltage level above the first voltage threshold at time T(11F).

In FIG. 12, a comparator 1212 in the VTM 1200 in FIG. 12 is configured to compare the voltage level of the supply voltage $V_{DD}$ to an analog voltage 1214, and generate a second threshold indication DROOP_LOW on a droop detector output 1216. The analog voltage 1214 is generated by a second DAC 1218 that receives second digital voltage information 1220. In a second example, the voltage droop status indicated by the droop indicator 404 is generated based on the droop detector output 1206 of the comparator 1202 and the output 1216 of the comparator 1212. In the second example, the droop indicator 404 indicates the voltage droop status indicating a TLD droop state in response to the comparator 1202 indicating that the voltage level of the supply voltage $V_{DD}$ drops below the first voltage threshold (time T(11C) in timing diagram 1100(*b*)), and returns to the no voltage droop state in response to the supply voltage $V_{DD}$ rising above the first voltage threshold (time T(11F) in timing diagram 1100(*b*)). Thus, the current-starved TLD circuit 500 starts starving current to the clock delay circuit 502, at time T(11C) in the second example.

The clock divider circuit 310, in the second example, does not begin reducing the clock frequency unless the voltage droop status of the droop indicator 404 indicates that the voltage level of the supply voltage $V_{DD}$ has drooped below the second voltage threshold indicating a clock-divider droop state. Thus, in the timing diagram 1100(*b*), the clock divider circuit 310 is notified to reduce the clock frequency of the delayed clock signal CLK_DEL at time T(11D). When the current-starved TLD circuit 500 exits from current-starving, the period of the delayed clock signal CLK_DEL becomes compressed until the clock periods of the delayed clock signal CLK_DEL are synchronized with the clock periods of the clock signal 306. If the period of the clock signal 306 is compressed after the clock divider circuit 310 has reduced the clock frequency, an increase in the clock period due to the change in frequency caused by the clock divider circuit 310 will compensate for compression of the period occurring in the current-starved TLD circuit 500.

However, in the second example, in which the clock divider circuit 310 is triggered in response to the supply voltage $V_{DD}$ drooping below the second voltage threshold, the clock divider circuit 310 would not reduce the clock frequency due to the voltage droop in Noise Scenario 1, shown in the timing diagram 1100(*a*). In this case, in response to the voltage droop status indicating a no voltage droop state at the end of the voltage droop, based on the droop indicator 404, the period of the delayed clock signal CLK_DEL is compressed to balance the period stretching. If the current paths 518(0)-518(N) immediately supply current to the clock delay circuit 502, the compression of the delayed clock signal CLK_DEL will occur suddenly, which may cause the clock period to be so short that an error may occur in the clocked circuit 304, as discussed above. To gradually invoke the clock period compression over many cycles after a voltage droop (i.e., to exit current-starving), the supplying of current to the clock delay circuit 502 can be staggered, as described in regard to the current stagger states 706(0)-706(N−1) in FIG. 7.

Figure 13:
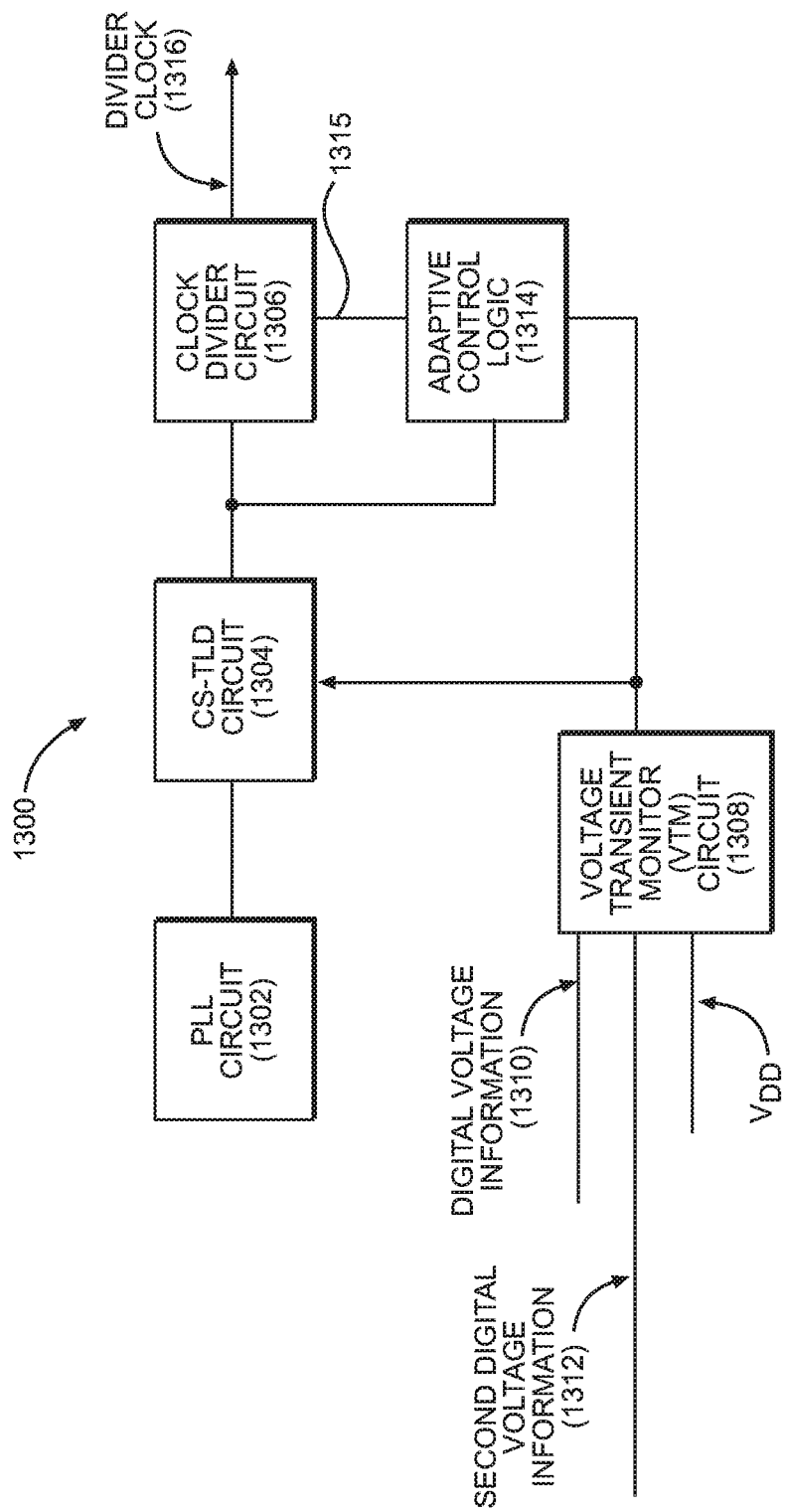
FIG. 13 is a block diagram of an exemplary ACD circuit that includes a current-starved TLD circuit and a clock divider circuit, but further includes a VTM circuit configured to detect a voltage droop in a supply voltage based on digital voltage information.

FIG. 13 is a block diagram of an exemplary ACD circuit 1300 that includes a PLL circuit 1302 which provides a stable, high frequency clock source, a current-starved TLD circuit 1304, and a clock divider circuit 1306. The ACD circuit 1300 includes a VTM circuit 1308 configured to detect a voltage droop in the supply voltage $V_{DD}$ based on digital voltage information 1310 and second digital voltage information 1312. In the exemplary ACD circuit 1300, the VTM circuit 1308, which receives the analog voltage 1214, replaces the all-digital DVM circuit 312 shown in FIGS. 3 and 4. The ACD circuit 1300 also includes adaptive control logic 1314 to receive the droop indicator 404 indicating a clock-divider droop state and generate an adaptive control signal 1315 to control the clock divider circuit 1306 to reduce the clock frequency of a divider clock 1316 supplied to clocked circuits (not shown).

Figure 14:
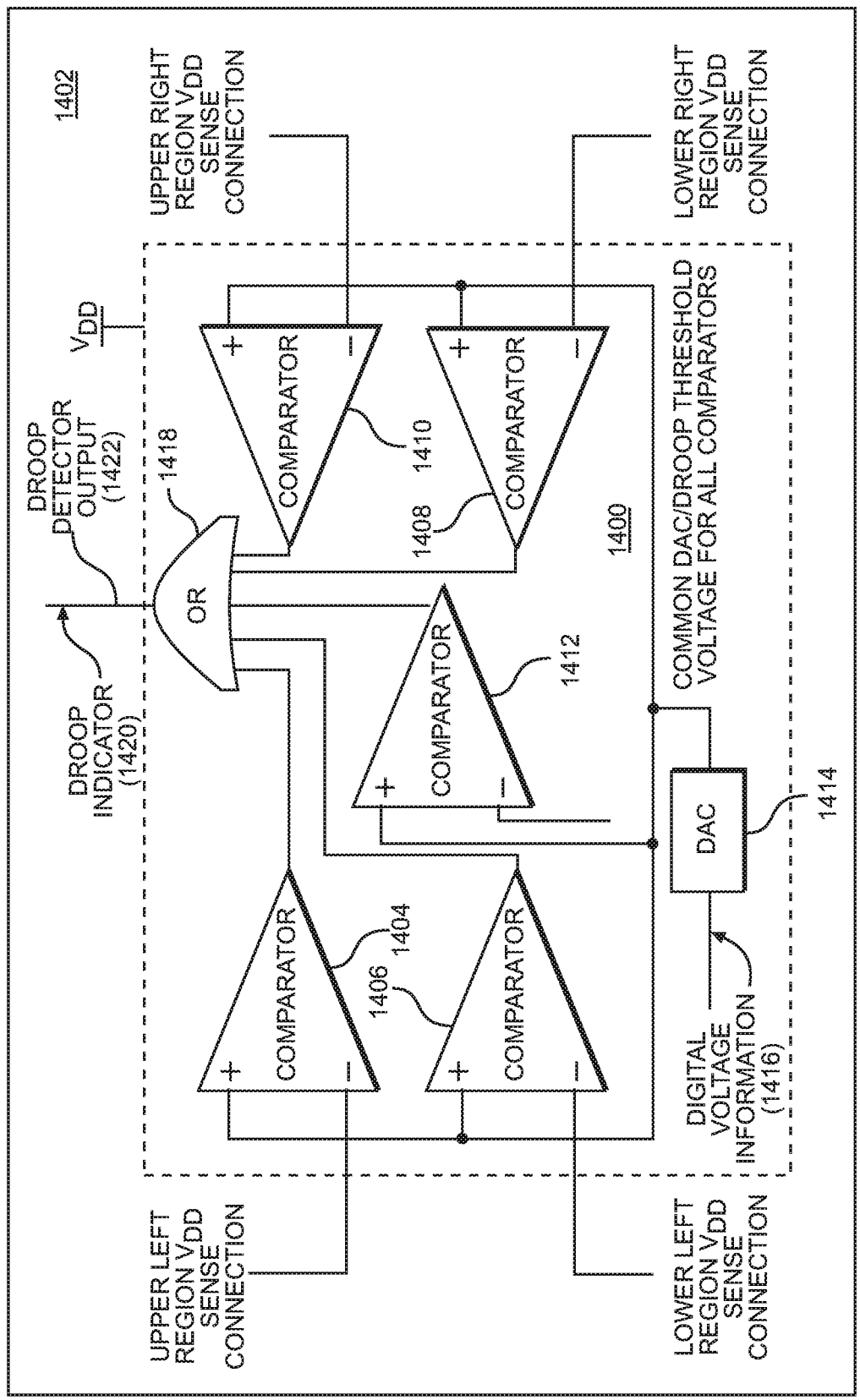
FIG. 14 is a block diagram of an exemplary VTM circuit configured to be included in an ACD circuit and centrally located in an IC chip with low impedance transmission line sense connections for sensing supply voltage droops in regions of the IC chip.

FIG. 14 is a block diagram of an exemplary droop detection circuit implemented as a VTM circuit 1400 configured to detect a voltage droop in any of five (5) regions of an IC 1402. The VTM circuit 1400 includes comparators 1404, 1406, 1408, 1410, and 1412, configured to sense a voltage level in upper left, lower left, lower right, upper right, and central regions, respectively, of the IC 1402. The comparators 1404, 1406, 1408, 1410, and 1412 are coupled to the supply voltage $V_{DD}$ in their respective regions by low-impedance transmission lines configured to minimize propagation delay and minimize the change in magnitude of the voltage droop from the point of origin of a noise event to the VTM circuit 1400. In one example, as illustrated in FIG. 14, each of the comparators 1404, 1406, 1408, 1410, and 1412 compare an analog voltage from a DAC 1414, based on digital voltage information 1416, to the voltage level of the supply voltage $V_{DD}$ sensed at each of the regions. The output of each of the comparators 1404, 1406, 1408, 1410, and 1412 is coupled to a 5-way OR gate 1418 to generate a droop indicator 1420 on a droop detector output 1422. The VTM circuit 1400 is used in conjunction with the current-starving circuit 504 in FIG. 5 to provide the droop indicator 404.

A current-starved TLD circuit employable in an ACD system to compensate for supply voltage $V_{DD}$ droops in clocked circuits of an IC, including a clock delay path having a clock signal delay that stretches a period of a clock signal based on a voltage droop, and further including a current-starving circuit to starve current to the clock delay circuit to further increase the clock signal delay beyond the delay caused by the voltage droop to further stretch the clock period, including but not limited to the current-starved TLD circuit in FIG. 5, and according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 15:
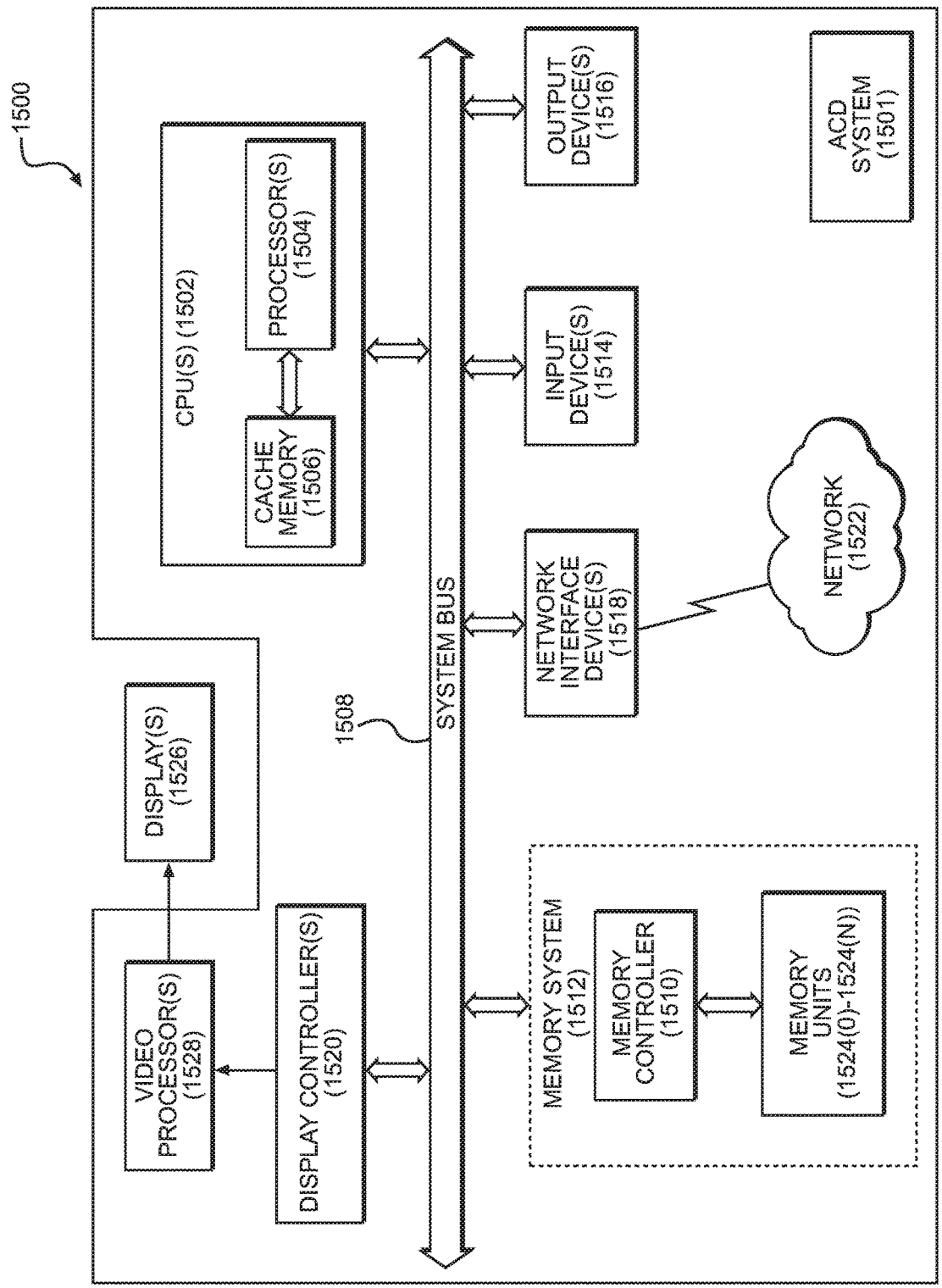
FIG. 15 is a block diagram of an exemplary processor-based system that can include an ACD circuit that includes a current-starved TLD circuit that includes a current-starving circuit configured to further stretch (i.e., increase) a clock signal delay, beyond a delay caused by a reduction in drive strength of clock delay circuits in the current-starved TLD circuit in response to a voltage droop, to further stretch the clock period in response to a detected voltage droop, including but not limited to the current-starved TLD circuit in FIG. 5.

In this regard, FIG. 15 illustrates an example of an ACD system 1501 employing a current-starved TLD circuit to compensate for supply voltage $V_{DD}$ droops in clocked circuits of an IC, including a clock delay path having a clock signal delay that stretches a period of a clock signal based on a voltage droop, and further including a current-starving circuit to starve current to the clock delay circuit to further increase the clock signal delay beyond the delay caused by the voltage droop to further stretch the clock period, including but not limited to the current-starved TLD circuit in FIG. 5. In this example, a processor-based system 1500 includes one or more CPUs 1502, each including one or more processors 1504. The CPU(s) 1502 may have cache memory 1506 coupled to the processor(s) 1504 for rapid access to temporarily stored data. The CPU(s) 1502 is coupled to a system bus 1508 and can intercouple master and slave devices included in the processor-based system 1500. As is well known, the CPU(s) 1502 communicates with these other devices by exchanging address, control, and data information over the system bus 1508. For example, the CPU(s) 1502 can communicate bus transaction requests to a memory controller 1510 as an example of a slave device. Although not illustrated of FIG. 15, multiple system buses 1508 could be provided, wherein each system bus 1508 constitutes a different fabric.

Other master and slave devices can be connected to the system bus 1508. As illustrated of FIG. 15, these devices can include a memory system 1512, one or more input devices 1514, one or more output devices 1516, one or more network interface devices 1518(0)-518(N), and one or more display controllers 1520, as examples. The input device(s) 1514 can include any type of input device, including, but not limited to, input keys, switches, voice processors, etc. The output device(s) 1516 can include any type of output device, including, but not limited to, audio, video, other visual indicators, etc. The network interface device(s) 1518(0)-518(N) can be any devices configured to allow exchange of data to and from a network 1522. The network 1522 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1518(0)-518(N) can be configured to support any type of communications protocol desired. The memory system 1512 can include one or more memory units 1524(0)-1524(N).

The CPU(s) 1502 may also be configured to access the display controller(s) 1520 over the system bus 1508 to control information sent to one or more displays 1526. The display controller(s) 1520 sends information to the display(s) 1526 to be displayed via one or more video processors 1528, which process the information to be displayed into a format suitable for the display(s) 1526. The display(s) 1526 can include any type of display, including, but not limited to, a cathode ray tube (CRT), a liquid crystal display (LCD), a plasma display, a light emitting diode (LED) display, etc.

Figure 16:
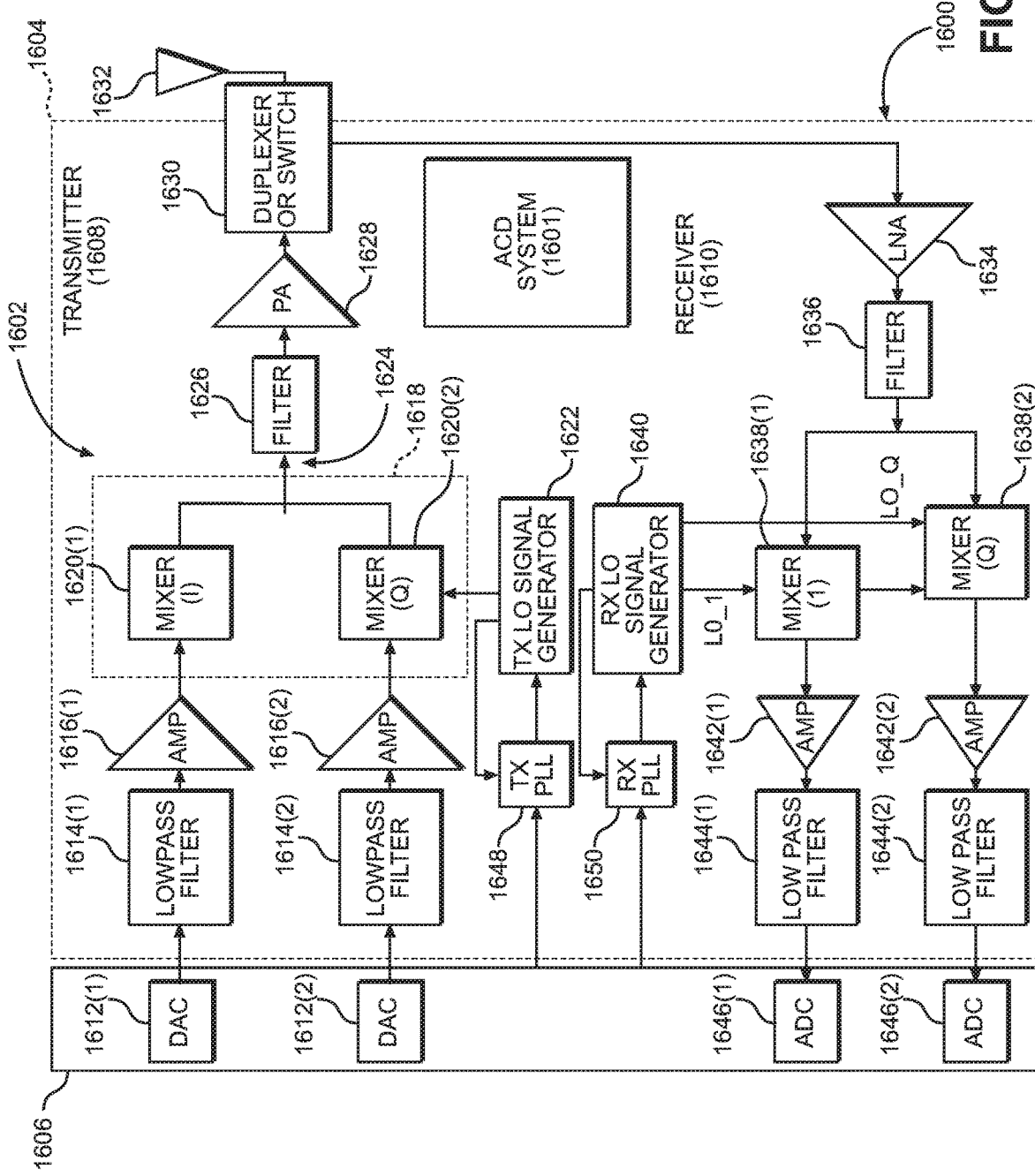
FIG. 16 is a block diagram of an exemplary wireless communications device that includes radio frequency (RF) components formed in an IC, wherein clocked circuits in the wireless communications device can include an ACD circuit that includes a current-starved TLD circuit that includes a current-starving circuit configured to further stretch (i.e., increase) a clock signal delay, beyond a delay caused by a reduction in drive strength of clock delay circuits in the current-starved TLD circuit in response to a voltage droop, to further stretch the clock period in response to a detected voltage droop, including but not limited to the current-starved TLD circuits in FIG. 5.

FIG. 16 illustrates an exemplary wireless communications device 1600 that includes radio frequency (RF) components formed in an IC 1602, wherein the IC 1602 can include an ACD system 1601 employing a current-starved TLD circuit to compensate for supply voltage $V_{DD}$ droops in clocked circuits of an IC, including a clock delay path having a clock signal delay that stretches a period of a clock signal based on a voltage droop, and further including a current-starving circuit to starve current to the clock delay circuit to further increase the clock signal delay beyond the delay caused by the voltage droop to further stretch the clock period, including but not limited to the current-starved TLD circuit in FIG. 5. In this regard, the wireless communications device 1600 may be provided in the IC 1602. The wireless communications device 1600 may include or be provided in any of the above referenced devices, as examples. As shown of FIG. 16, the wireless communications device 1600 includes a transceiver 1604 and a data processor 1606. The data processor 1606 may include a memory to store data and program codes. The transceiver 1604 includes a transmitter 1608 and a receiver 1610 that support bi-directional communications. In general, the wireless communications device 1600 may include any number of transmitters 1608 and/or receivers 1610 for any number of communication systems and frequency bands. All or a portion of the transceiver 1604 may be implemented on one or more analog ICs, RF ICs (RFICs), mixed-signal ICs, etc.

The transmitter 1608 or the receiver 1610 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1610. In the direct-conversion architecture, a signal is frequency-converted between RF and baseband in one stage. The super-heterodyne and direct-conversion architectures may use different circuit blocks and/or have different requirements. In the wireless communications device 1600 of FIG. 16, the transmitter 1608 and the receiver 1610 are implemented with the direct-conversion architecture.

In the transmit path, the data processor 1606 processes data to be transmitted and provides I and Q analog output signals to the transmitter 1608. In the exemplary wireless communications device 1600, the data processor 1606 includes DACs 1612(1), 1612(2) for converting digital signals generated by the data processor 1606 into the I and Q analog output signals, e.g., I and Q output currents, for further processing.

Within the transmitter 1608, low pass filters 1614(1), 1614(2) filter the I and Q analog output signals, respectively, to remove undesired signals caused by the prior digital-to-analog conversion. Amplifiers (AMP) 1616(1), 1616(2) amplify the signals from the low pass filters 1614(1), 1614(2), respectively, and provide I and Q baseband signals. An upconverter 1618 upconverts the I and Q baseband signals with I and Q transmit (TX) local oscillator (LO) signals through mixers 1620(1), 1620(2) from a TX LO signal generator 1622 to provide an upconverted signal 1624. A filter 1626 filters the upconverted signal 1624 to remove undesired signals caused by the frequency upconversion as well as noise in a receive frequency band. A power amplifier (PA) 1628 amplifies the upconverted signal 1624 from the filter 1626 to obtain the desired delivered power level and provides a transmit RF signal. The transmit RF signal is routed through a duplexer or switch 1630 and transmitted via an antenna 1632.

In the receive path, the antenna 1632 receives signals transmitted by base stations and provides a received RF signal, which is routed through the duplexer or switch 1630 and provided to a low noise amplifier (LNA) 1634. The duplexer or switch 1630 is designed to operate with a specific receive (RX)-to-TX duplexer frequency separation, such that RX signals are isolated from TX signals. The received RF signal is amplified by the LNA 1634 and filtered by a filter 1636 to obtain a desired RF input signal. Down-conversion mixers 1638(1), 1638(2) mix the output of the filter 1636 with I and Q RX LO signals (i.e., LO_I and LO_Q) from an RX LO signal generator 1640 to generate I and Q baseband signals. The I and Q baseband signals are amplified by amplifiers (AMP) 1642(1), 1642(2) and further filtered by low pass filters 1644(1), 1644(2) to obtain I and Q analog input signals, which are provided to the data processor 1606. In this example, the data processor 1606 includes analog-to-digital converters (ADCs) 1646(1), 1646(2) for converting the analog input signals into digital signals to be further processed by the data processor 1606.

In the wireless communications device 1600 of FIG. 16, the TX LO signal generator 1622 generates the I and Q TX LO signals used for frequency upconversion, while the RX LO signal generator 1640 generates the I and Q RX LO signals used for frequency downconversion. Each LO signal is a periodic signal with a particular fundamental frequency. A TX PLL circuit 1648 receives timing information from the data processor 1606 and generates a control signal used to adjust the frequency and/or phase of the TX LO signals from the TX LO signal generator 1622. Similarly, an RX PLL circuit 1650 receives timing information from the data processor 1606 and generates a control signal used to adjust the frequency and/or phase of the RX LO signals from the RX LO signal generator 1640.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A current-starved tunable-length delay (TLD) circuit for delaying a clock signal distributed in an adaptive clock distribution (ACD) system to a clocked circuit, the current-starved TLD circuit comprising:
   a clock delay circuit comprising a clock input configured to receive a clock signal; and
   a current-starving circuit, comprising:
      a power input coupled to a power rail;
      a current output coupled to the clock delay circuit;
      a droop indicator input configured to receive a droop indicator indicating a voltage droop status of a voltage droop in a supply voltage;

a current-starving control circuit configured to generate a current-starving control indicator in response to the droop indicator; and a current supply circuit configured to selectively starve current supplied on the current output coupled to the clock delay circuit in response to the current-starving control indicator indicating the voltage droop status of the voltage droop in the supply voltage;

the clock delay circuit configured to generate a delayed clock signal based on a delay of the clock signal based on the selectively starved current;

wherein:

the current supply circuit comprises a plurality of current paths, each current path of the plurality of current paths comprising:

a power supply input coupled to the power input of the current-starving circuit;

a power output coupled to the current output of the current-starving circuit; and a control input configured to receive the current-starving control indicator; and each current path of the plurality of current paths is configured to selectively supply current from the power supply input to the power output based on the current-starving control indicator.

2. The current-starved TLD circuit of claim 1, wherein the clock delay circuit is configured to generate the delayed clock signal based on the delay of the clock signal based on the selectively starved current and a magnitude of the supply voltage at the power rail.

3. The current-starved TLD circuit of claim 1, wherein each current path of the plurality of current paths of the current supply circuit further comprises a switch configured to selectively supply the current from the power supply input to the power output based on the current-starving control indicator.

4. The current-starved TLD circuit of claim 1, wherein the current supply circuit further comprises a base current path coupled to the power input and the current output of the current-starving circuit.

5. The current-starved TLD circuit of claim 1, wherein:

the current-starving control circuit further comprises:

the droop indicator input configured to receive the droop indicator; and a current-starving control output; and the current-starving control circuit is configured to generate the current-starving control indicator on the current-starving control output in response to the droop indicator.

6. The current-starved TLD circuit of claim 1, wherein:

the current-starving control circuit is further configured to generate the current-starving control indicator indicating a current starve state in response to the droop indicator indicating the voltage droop status; and the current supply circuit is configured to decouple the power supply input from the power output of each of the plurality of current paths to starve current to the clock delay circuit, in response to the current-starving control indicator indicating the current starve state.

7. The current-starved TLD circuit of claim 1, wherein:

the current-starving control circuit is further configured to generate the current-starving control indicator indicating a current starve state in response to the droop indicator indicating the voltage droop status; and the current supply circuit is configured to decouple the power supply input from the power output of at least one current path among the plurality of current paths, in response to the current-starving control indicator indicating the current starve state.

8. The current-starved TLD circuit of claim 7, wherein:

the current-starving control circuit is further configured to generate the current-starving control indicator indicating a current supply state in response to the droop indicator indicating the voltage droop status indicating a no voltage droop state; and the current supply circuit is configured to couple the power supply input to the power output of the at least one current path among the plurality of current paths, in response to the current-starving control indicator indicating the current supply state.

9. The current-starved TLD circuit of claim 8, wherein:

the current-starving control circuit is configured to generate the current-starving control indicator by being configured to:

generate the current-starving control indicator indicating a first current supply state in response to the droop indicator indicating the voltage droop status indicating the no voltage droop state; and generate the current-starving control indicator indicating a second current supply state after generation of the current-starving control indicator indicating the first current supply state; and the current supply circuit is configured to:

couple a first power supply input to a first power output of a first current path among the plurality of current paths, in response to the current-starving control indicator indicating the first current supply state; and couple a second power supply input to a second power output of a second current path among the plurality of current paths, in response to the current-starving control indicator indicating the second current supply state.

10. The current-starved TLD circuit of claim 9, wherein:

the current-starving control circuit further comprises a clock input configured to receive the delayed clock signal; and the current-starving control circuit is configured to generate the current-starving control indicator indicating the second current supply state based on a predetermined number of clock periods of the delayed clock signal after generation of the current-starving control indicator indicating the first current supply state.

11. The current-starved TLD circuit of claim 1 integrated into an integrated circuit (IC).

12. The current-starved TLD circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

13. A current-starved tunable-length delay (TLD) circuit for delaying a clock signal distributed in an adaptive clock distribution (ACD) system to a clocked circuit, the current-starved TLD circuit comprising:

a means for receiving a clock signal;
a means for receiving a droop indicator indicating a voltage droop status of a voltage droop in a supply voltage;
a means for generating a current-starving control indicator in response to the droop indicator indicating the voltage droop status of the voltage droop in the supply voltage;
a means for selectively starving current supplied to a clock delay circuit in response to the current-starving control indicator indicating the voltage droop status; and
a means for generating a delayed clock signal based on a delay of the clock signal in the clock delay circuit based on the means for selectively starving the current;
wherein:
the means for generating the current-starving control indicator further comprises:
the means for generating the current-starving control indicator indicating a first current supply state in response to the droop indicator indicating a no voltage droop state; and
the means for generating the current-starving control indicator indicating a second current supply state in response to the droop indicator indicating the no voltage droop state; and
the current-starved TLD circuit further comprises:
a means for supplying current on a first one among a plurality of current paths, in response to the current-starving control indicator indicating the first current supply state; and
a means for supplying current to a second one among the plurality of current paths, in response to the current-starving control indicator indicating the second current supply state.

14. A method of current-starving a tunable-length delay (TLD) circuit in an adaptive clock distribution (ACD) system, comprising:
receiving a clock signal;
receiving a droop indicator indicating a voltage droop status of a voltage droop in a supply voltage;
generating a current-starving control indicator in response to the droop indicator indicating the voltage droop status of the voltage droop in the supply voltage;
selectively starving current supplied to a clock delay circuit in response to the current-starving control indicator indicating the voltage droop status; and
generating a delayed clock signal based on a delay of the clock signal in the clock delay circuit based on the selectively starved current;
wherein:
generating the current-starving control indicator comprises:
generating the current-starving control indicator indicating a first current supply state in response to the droop indicator indicating a no voltage droop state; and
generating the current-starving control indicator indicating a second current supply state in response to the droop indicator indicating the no voltage droop state; and
the method further comprises:
supplying current on a first one among a plurality of current paths, in response to the current-starving control indicator indicating the first current supply state; and
supplying current to a second one among the plurality of current paths, in response to the current-starving control indicator indicating the second current supply state.

15. The method of claim 14, wherein:
generating the delayed clock signal based on the delay of the clock signal in the clock delay circuit is based on the selectively starved current and a magnitude of the supply voltage at a power rail.

16. The method of claim 14, further comprising:
generating the current-starving control indicator indicating a current starve state in response to the droop indicator indicating the voltage droop status; and
starving current on the plurality of current paths to the clock delay circuit, in response to the current-starving control indicator indicating the current starve state.

17. The method of claim 14, further comprising:
generating the current-starving control indicator indicating a current starve state in response to the droop indicator indicating the voltage droop status; and
starving current on at least one current path among the plurality of current paths to the clock delay circuit, in response to the current-starving control indicator indicating the current starve state.

18. The method of claim 17, further comprising:
generating the current-starving control indicator indicating a current supply state in response to the droop indicator indicating the no voltage droop state; and
supplying current on the at least one current path among the plurality of current paths to the clock delay circuit, in response to the current-starving control indicator indicating the current supply state.

19. The method of claim 15, further comprising:
generating the current-starving control indicator indicating the second current supply state based on a predetermined number of clock periods of the delayed clock signal after generating the current-starving control indicator indicating the first current supply state.

20. An adaptive clock distribution (ACD) system for slowing a frequency of a clock signal distributed to a clocked circuit, the ACD system comprising:
a droop detector circuit configured to detect a voltage droop in a supply voltage at a power rail, and generate a droop indicator indicating a voltage droop status of the voltage droop in the supply voltage;
a current-starved tunable-length delay (TLD) circuit, comprising:
a clock delay circuit comprising a clock input configured to receive a clock signal; and
a current-starving circuit comprising:
a current-starving control circuit configured to generate a current-starving control indicator in response to the droop indicator; and
a current supply circuit configured to selectively starve current to the clock delay circuit in response to the current-starving control indicator indicating the voltage droop status of the voltage droop in the supply voltage;
the clock delay circuit configured to generate a delayed clock signal based on a delay of the clock signal based on the selectively starved current;
wherein:
the current supply circuit comprises a plurality of current paths, each current path of the plurality of current paths comprising:
a power supply input coupled to a power input of the current-starving circuit;

a power output coupled to a current output of the current-starving circuit; and
a control input configured to receive the current-starving control indicator; and
each current path of the plurality of current paths is configured to selectively supply current from the power supply input to the power output based on the current-starving control indicator.

21. The ACD system of claim 20, further comprising:
an adaptive control circuit configured to generate an adaptive control signal in response to the droop indicator indicating the voltage droop status indicating a clock-divider droop state; and
a clock divider circuit configured to:
receive the delayed clock signal, the delayed clock signal having a clock frequency; and
generate a divider clock signal having a frequency lower than a clock frequency of the delayed clock signal in response to the adaptive control signal indicating the clock-divider droop state.

22. The ACD system of claim 21, wherein the droop detector circuit comprises:
a supply voltage input configured to receive the supply voltage;
a droop detector output; and
a droop detection circuit configured to:
determine the voltage droop status of the voltage droop of the supply voltage; and
generate the droop indicator on the droop detector output, the droop indicator indicating the voltage droop status indicating a TLD droop state in response to a first magnitude of the voltage droop, and the droop indicator indicating the voltage droop status indicating the clock-divider droop state in response to a second magnitude of the voltage droop larger than the first magnitude.

23. The ACD system of claim 20, wherein:
the current-starving control circuit is further configured to generate the current-starving control indicator indicating a current starve state in response to the droop indicator indicating the voltage droop status; and
the current supply circuit is configured to employ at least one current path among the plurality of current paths to starve current to the clock delay circuit, based on the current-starving control indicator indicating the current starve state.

24. The ACD system of claim 20, wherein:
the current-starving control circuit is further configured to generate the current-starving control indicator indicating a current starve state in response to the droop indicator indicating the voltage droop status; and
the current supply circuit is configured to control each current path of the plurality of current paths to starve current to the clock delay circuit based on the current-starving control indicator indicating the current starve state.

25. The ACD system of claim 24, wherein the current-starving circuit is further configured to:
generate the current-starving control indicator indicating a first current supply state in response to the droop indicator indicating a no voltage droop state;
generate the current-starving control indicator indicating a second current supply state after generating the current-starving control indicator indicating the first current supply state; and
the current supply circuit is further configured to:
employ a first current path of the plurality of current paths to supply current to the clock delay circuit based on the current-starving control indicator indicating the first current supply state; and
employ a second current path of the plurality of current paths to supply current to the clock delay circuit based on the current-starving control indicator indicating the second current supply state.

26. The ACD system of claim 20, wherein the droop detector circuit further comprises a voltage transient monitor (VTM) circuit comprising:
a digital-to-analog converter (DAC) configured to convert digital voltage information to an analog voltage; and
a comparator circuit configured to generate the droop indicator indicating the voltage droop status in response to a comparison of the analog voltage and a voltage level based on a magnitude of the supply voltage.

27. The ACD system of claim 26, wherein the comparator circuit is further configured to generate the droop indicator indicating the voltage droop status indicating a TLD droop state;
the VTM circuit further comprising:
a second DAC configured to convert second digital voltage information to a second analog voltage; and
a second comparator circuit configured to generate the droop indicator indicating the voltage droop status indicating a clock-divider droop state in response to a comparison of the second analog voltage and the voltage level based on the magnitude of the supply voltage.

28. The ACD system of claim 20, wherein the droop detector circuit comprises:
a plurality of low-impedance conductors each coupled to a different power rail in one of a plurality of locations in a clocked circuit;
a plurality of voltage comparators, each voltage comparator coupled to a respective one of the plurality of low-impedance conductors, and each of the plurality of voltage comparators configured to compare a voltage on a corresponding low-impedance conductor to a threshold voltage, and generate a droop indication based on the comparison; and
an OR circuit configured to receive the droop indication from each of the plurality of voltage comparators, and generate the droop indicator indicating the voltage droop status of the voltage droop in the supply voltage in at least one of the plurality of locations.

* * * * *